US011133256B2

(12) United States Patent
Jain et al.

(10) Patent No.: US 11,133,256 B2
(45) Date of Patent: Sep. 28, 2021

(54) EMBEDDED BRIDGE SUBSTRATE HAVING AN INTEGRAL DEVICE

(71) Applicant: Intel Corporation, Santa Clara, CA (US)

(72) Inventors: Amit Kumar Jain, Portland, OR (US); Sameer Shekhar, Portland, OR (US); Chin Lee Kuan, Bentong (MY); Kevin Joseph Doran, North Plains, OR (US); Dong-Ho Han, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/446,920

(22) Filed: Jun. 20, 2019

(65) Prior Publication Data

US 2019/0304915 A1 Oct. 3, 2019

(51) Int. Cl.
*H01L 23/538* (2006.01)
*H01L 49/02* (2006.01)
*H01L 23/00* (2006.01)

(52) U.S. Cl.
CPC ...... *H01L 23/5381* (2013.01); *H01L 23/5383* (2013.01); *H01L 28/20* (2013.01);
(Continued)

(58) Field of Classification Search
CPC . H01L 23/5381; H01L 23/5383; H01L 28/20; H01L 28/40; H01L 2224/16225; H01L 23/5384; H01L 24/16; H01L 2224/131; H01L 2224/16227; H01L 23/15; H01L 23/147; H01L 2224/16235; H01L 23/49811; H01L 23/13; H01L 23/5385; H01L 2021/60007; H01L 2021/60097; H01L 2021/60285; H01L 23/488; H01L 23/492; H01L 24/26; H01L 33/62; H01L 35/08; H01L 2224/03013; H01L 2224/26; H01L 2224/40491; H01L 2224/80801; H01L 2224/80815; H01L 27/00; H01L 27/01; H01L 27/02; H01L 27/14; H01L 27/15; H01L 27/16; H01L 27/18; H01L 27/20; H01L 27/22; H01L 27/24;
(Continued)

(56) References Cited

U.S. PATENT DOCUMENTS 5,644,167 A * 7/1997 Weiler .................. H01L 23/60
257/203
6,265,756 B1 * 7/2001 Brockett ............ H01L 27/0248
257/173
(Continued)

FOREIGN PATENT DOCUMENTS

CN 112117264 A 12/2020

*Primary Examiner* — Samuel Park
(74) *Attorney, Agent, or Firm* — Patent Capital Group

(57) ABSTRACT

Microelectronic assemblies, related devices, and methods are disclosed herein. In some embodiments, a microelectronic assembly may include a package substrate; a bridge, embedded in the package substrate, wherein the bridge includes an integral passive component, and wherein a surface of the bridge include first contacts in a first interconnect area and second contacts in a second interconnect area; a first die coupled to the passive component via the first contacts in the first interconnect area; and a second die coupled to the second contacts in the second interconnect area.

17 Claims, 10 Drawing Sheets

(52) U.S. Cl.
CPC .......... *H01L 28/40* (2013.01); *H01L 23/5384* (2013.01); *H01L 24/16* (2013.01); *H01L 2224/16225* (2013.01)

(58) Field of Classification Search
CPC ......... H01L 27/26; H01L 27/28; H01L 21/00; H01L 22/00; H01L 2221/00; H01L 2223/00; H01L 2224/00; H01L 2225/00; H01L 2227/00; H01L 2229/00; H01L 2251/00; H01L 23/00; H01L 24/00; H01L 25/00; H01L 28/00; H01L 29/00; H01L 2924/00; H01L 2933/00; H01L 31/00; H01L 33/00; H01L 35/00; H01L 37/00; H01L 39/00; H01L 41/00; H01L 43/00; H01L 45/00; H01L 47/00; H01L 49/00; H01L 51/00; H01L 21/4853; H01L 21/4871; H01L 23/5386; H01L 23/36; H01L 25/50; H01L 25/0655; H01L 23/48; H01L 23/367; H01L 2924/15159; H01L 2224/92125; H01L 2224/81203; H01L 2224/81193; H01L 2224/81192; H01L 2224/81191; H01L 2224/73204; H01L 2224/32225; H01L 2224/13147; H01L 2224/0612; H01L 24/92; H01L 24/81; H01L 24/73; H01L 24/32; H01L 24/13; H01L 24/17; H01L 24/19; H01L 23/5389; H01L 23/49816; H01L 23/3128; H01L 25/18; H01F 2017/065; H01R 13/658; H03F 220/114; H04N 5/3577; H04Q 1/116; H05K 9/0009; H05K 9/0081
See application file for complete search history.

(56) References Cited

U.S. PATENT DOCUMENTS

| | | | |
|---|---|---|---|
| 7,808,075 B1* | 10/2010 | Cheng | H01L 23/60 |
| | | | 257/528 |
| 8,901,748 B2 | 12/2014 | Manusharow et al. | |
| 9,275,955 B2 | 3/2016 | Mahajan et al. | |
| 10,163,798 B1 | 12/2018 | Alur et al. | |
| 10,504,848 B1* | 12/2019 | Parto | H01L 23/5389 |
| 10,535,608 B1* | 1/2020 | Rubin | H01L 21/6835 |
| 2013/0063843 A1* | 3/2013 | Chen | H01L 25/0652 |
| | | | 361/56 |
| 2015/0171015 A1* | 6/2015 | Mahajan | H01L 21/568 |
| | | | 257/712 |
| 2016/0071818 A1* | 3/2016 | Wang | H01L 24/06 |
| | | | 257/774 |
| 2016/0343666 A1* | 11/2016 | Deshpande | H01L 23/522 |
| 2016/0379923 A1 | 12/2016 | Zhang et al. | |
| 2017/0040264 A1 | 2/2017 | Qian et al. | |
| 2017/0092602 A1* | 3/2017 | Meyers | H01L 25/0657 |
| 2017/0125398 A1* | 5/2017 | Nomura | H01L 29/866 |
| 2018/0240778 A1 | 8/2018 | Liu et al. | |
| 2018/0261545 A1 | 9/2018 | Sundaram | |
| 2019/0206792 A1* | 7/2019 | Collins | H01L 25/0655 |
| 2020/0006232 A1* | 1/2020 | Pietambaram | H01L 25/0655 |
| 2020/0111734 A1* | 4/2020 | Lin | H03K 19/1776 |

\* cited by examiner

EMBEDDED BRIDGE SUBSTRATE HAVING AN INTEGRAL DEVICE

BACKGROUND

Integrated circuit (IC) packages may include an embedded bridge, such as an embedded multi-die interconnect bridge (EMIB), for coupling two or more IC dies, and other devices, such as capacitors and resistors, for managing power delivery to IC dies. Typically, IC packages may include devices surface-mounted on a backside of a die or on a land side of a circuit board.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1:
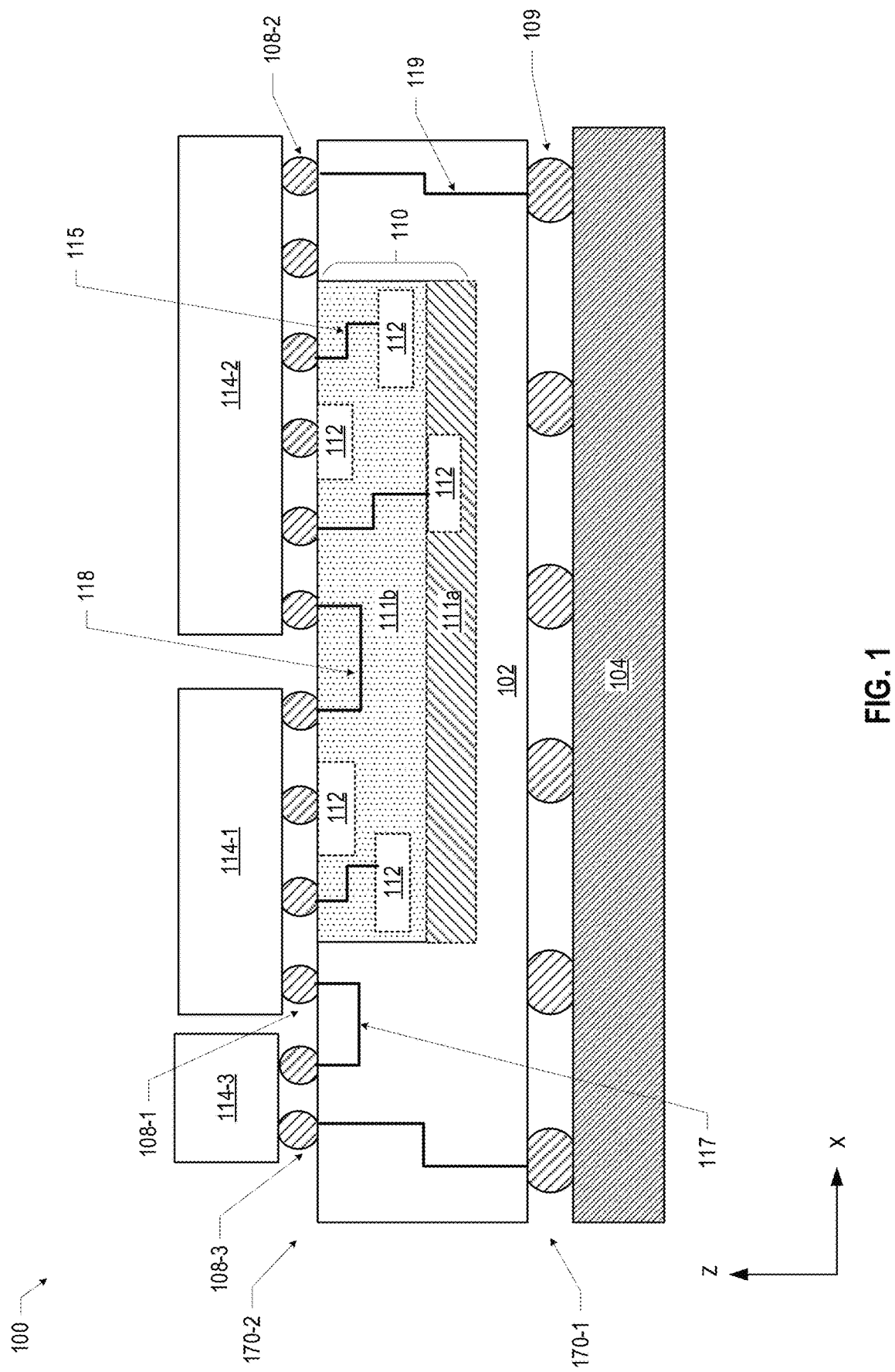
FIG. 1 is a side, cross-sectional view of an example microelectronic assembly, in accordance with various embodiments.

Disclosed herein are microelectronic assemblies including an interconnect bridge having an integrated component, as well as related apparatuses and methods. For example, in some embodiments, a microelectronic assembly may include a package substrate; a bridge, embedded in the package substrate, wherein the bridge includes a passive component, and wherein a surface of the bridge includes first contacts in a first interconnect area and second contacts in a second interconnect area; a first die coupled to the passive component via the first contacts in the first interconnect area; and a second die coupled to the second contacts in the second interconnect area.

The drive for miniaturization of IC devices has created a similar drive to provide dense interconnections between dies in a package assembly. For example, interposers and bridges, such as EMIB architecture, are emerging to provide dense interconnect routing between dies or other electrical components. To increase the functionality of a package substrate, an interposer or a bridge may be embedded in the package substrate to route signals between one or more dies. Such interposers and bridges may take advantage of semiconductor processing techniques to form dense interconnect routing features. Passive components (also referred to herein as "passive devices"), such as resistors and/or capacitors, that improve IC device efficiency are generally prefabricated and surface-mounted to a circuit board or a die, or may be embedded in the package substrate in a region separate from the interconnect bridge region. Each of these components would have been purchased separately, and then separately assembled into the package substrate, with each such component adding significant cost and process complexity.

Various ones of the embodiments disclosed herein provide resistor structures for periodic and/or repetitive calibration and capacitor structures for functionality fabricated directly into an interconnect bridge. Additionally, various ones of the embodiments disclosed herein apply existing semiconductor processing techniques to fabricate resistors and capacitors on the same metal layer or on different metal layers (e.g., resistors may be formed at a surface of the interconnect bridge and capacitors may be embedded in a metal layer within the interconnect bridge). Resistor structures disclosed herein may improve calibration accuracy as compared with conventional methods. For example, a calibration may be performed when a die is between different functional modes or is operating at different temperatures. As used herein, calibration may refer to determining a current of a circuit based on a known voltage and a known resistance, and/or may refer to determining a number of transistors connected in parallel to achieve a target resistance. In some embodiments, a calibration may be used to determine whether to adjust an electrical parameter of a circuit. For example, a calibration may be used to adjust a voltage of a circuit to minimize power consumption. Capacitor structures disclosed herein may reduce signal noise, including electromagnetic interference (EMI) and/or radio frequency interference (RFI), and may improve IC device functionality.

The processes disclosed herein may be used to integrate a variety of functionalities directly into an interconnect bridge, which may eliminate or reduce the need to separately acquire prepackaged components and may lower assembly costs. Relative to the higher cost of embedding separate prefabricated devices in a package substrate, or fabricating resistors and capacitors directly in silicon, various ones of the embodiments disclosed herein may enable resistors and capacitors to be formed inexpensively in an interconnect bridge. Such embodiments may be particularly advantageous in computing applications, system-in-package applications, and server applications (in which capacitors may be used in voltage regulators to meet a high demand for power delivery). The embodiments disclosed herein may achieve improved integration of logic in IC packages by putting resistors and capacitors in otherwise unavailable real estate in the package substrate, increasing functionality without increasing the z-height of the packages (and potentially reducing the z-height of packages by removing conventional "external" capacitors). This improvement in computing density may enable new form factors for wearable computing devices and system-in-package applications in which z-height is constrained.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," "with," and the like, as used with respect to embodiments of the present disclosure, are synonymous. As used herein, a "package" and an "IC package" are synonymous, as are a "die" and an "IC die." As used herein, the terms "bridge," "interconnect bridge," "EMIB," and "interposer" may be used interchangeably. The terms "top" and "bottom" may be used herein to explain various features of the drawings, but these terms are simply for ease of discussion, and do not imply a desired or required orientation. As used herein, the term "insulating" means "electrically insulating," unless otherwise specified. Throughout the specification, and in the claims, the term "coupled" means a direct connection, such as a direct electrical, mechanical, or magnetic connection between the things that are connected, or an indirect connection, through one or more passive or active intermediary devices. The meaning of "a," "an," and "the" include plural references. The meaning of "in" includes "in" and "on."

When used to describe a range of dimensions, the phrase "between X and Y" represents a range that includes X and Y. For convenience, the phrase "FIG. 2" may be used to refer to the collection of drawings of FIGS. 2A-2C, the phrase "FIG. 3" may be used to refer to the collection of drawings of FIGS. 3A-3C, etc. Although certain elements may be referred to in the singular herein, such elements may include multiple sub-elements. For example, "an insulating material" may include one or more insulating materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via).

FIG. 1 is a cross-sectional side view of a microelectronic assembly 100 including a package substrate 102, a bridge 110 embedded in the package substrate 102, and multiple dies 114 disposed thereon. The package substrate 102 may have a first surface 170-1 and an opposing second surface 170-2. A surface of the bridge 110 may be flush with the second surface 170-2 of the package substrate 102. The bridge 110 may include a substrate 111$a$ and one or more routing layers 111$b$ having high density conductive pathways 118 (e.g., traces and/or vias) through an insulating material (e.g., a dielectric material formed in multiple layers) for routing electrical signals between the dies 114-1, 114-2. In some embodiments, the bridge may include dielectric layers that alternate with conductive trace layers. The bridge 110 may be made of any suitable material. For example, in some embodiments, the insulating material may be a semiconductor material (e.g., silicon or germanium), a III-V material (e.g., gallium nitride), silicon oxide, or glass. Although the term "insulating material" is used herein, different layers of the insulating material in a bridge 110 may be formed of different materials.

The bridge 110 may include one or more integral devices 112, in accordance with various embodiments. In some embodiments, one or more integral devices 112 may be included in the substrate layer 111$a$. In some embodiments, one or more integral devices 112 may be included in the routing layers 111$b$. An integral device 112 may be a resistor or a capacitor. In some embodiments, the integral device 112 is a thin film resistor (TFR) that may be use in the calibration of a circuit of a die 114. As used herein, a TFR used for calibrating a circuit may be referred to as a calibration TFR (cTFR). In some embodiments, the integral device is a capacitor such as a trench capacitor, a metal-oxide-semiconductor (MOS) capacitor, a metal-insulator-metal (MIM) capacitor, or a parallel plate capacitor.

In some embodiments, the bridge 110 may include features of an integral device 112 such that the integral device is integrated in the bridge 110 during manufacturing. In some embodiments, the integral devices 112 may be formed on the bridge 110 using, for example, semiconductor manufacturing techniques. In some embodiments, the integral devices 112 may include routing structures (e.g., trenches and/or vias) formed using complementary metal-oxide-semiconductor (CMOS) fabrication techniques such as thin film deposition, etch, and/or lithography processes. The techniques may be similar to those used to fabricate back-end interconnect routing (e.g., trenches and/or vias) on a die.

The bridge 110 may include multiple integral devices 112 disposed at the surface of the bridge 110, at different distances from the surface of the bridge 110 (i.e., in the z-direction), and at different lateral locations in the bridge 110 (e.g., in the x-direction). For example, the bridge 110 may include integral devices 112 between multiple sets of layers of the insulating material in the bridge 110 and/or multiple integral devices 112 on a single layer of the insulating material. As noted above, an integral device 112 may include one or more calibration resistors and/or capacitors. A number of embodiments of resistors and capacitors that may be included in the bridge 110 as integral devices 112 are disclosed herein, and any of these embodiments may be included in any suitable combination in a bridge 110. The bridge 110 may also include conductive pathways 115 through the insulating material that couple the integral devices 112 to the dies 114. Any suitable arrangement of conductive pathways 115, 118 may couple the dies 114 and the integral devices 112, as desired. In some embodiments, the conductive pathways 115, 118 may be a metal, such as copper, or may be a metal alloy.

The dies 114 may be coupled to the second surface 170-2 of the package substrate 102 via first level interconnects 108-1, 108-2, 108-3, as illustrated. The dies 114-1, 114-2 may be coupled to an integral device 112 at the surface of the bridge 110 via the first level interconnects 108, or may be coupled to an integral device 112 within the bridge 110 via the first level interconnects 108 and the conductive pathways 115. In some embodiments, the first level interconnects 108 may include solder bumps or balls (as illustrated in FIG. 1); in other embodiments, the first level interconnects 108 may include wirebonds or any other suitable interconnect. Although three dies 114 are illustrated in FIG. 1, this is simply an example, and the microelectronic assembly 100 may include one or more dies 114. The dies 114 may perform any suitable functionality, and may include processing devices, memory, communications devices, sensors, or any other computing components or circuitry. For example, the die 114 may be a central processing unit (CPU), a graphics processing unit (GPU), an application-specific integrated circuit (ASIC), a programmable logic device (PLD), a platform controller hub (PCH), or any other desired processor or logic device. A memory die, for example, may be an erasable-programmable read-only memory (EPROM) chip, a non-volatile memory (e.g., 3D XPoint) chip, a volatile memory (e.g., high bandwidth memory) chip, stacked memory, or any other suitable memory device. In some embodiments, the die 114 may be an input/output (I/O) interface and may include I/O circuitry. In some embodiments, the die 114 may be a voltage regulator and may include voltage regulator circuitry. In some embodiments, one of the dies 114-1 may be a PLD and the other die 114-2 may be a GPU. In some embodiments, the die 114-1 may be a CPU and the die 114-2 may be a memory die. In some embodiments, the die 114-1 may be a CPU and the die 114-2 may be a memory die. In some embodiments, an underfill material (not shown) may be disposed between the dies 114 and the second surface 170-2 of the package substrate 102. In some embodiments, an overmold material (not shown) may be disposed around the dies 114 and in contact with the second surface 170-2 of the package substrate 102.

The dies 114 disclosed herein may include an insulating material (e.g., a dielectric material formed in multiple layers, as known in the art) and multiple conductive pathways formed through the insulating material. In some embodiments, the insulating material of a die 114 may include a dielectric material, such as silicon dioxide, silicon nitride, oxynitride, polyimide materials, glass reinforced epoxy matrix materials, or a low-k or ultra low-k dielectric (e.g., carbon-doped dielectrics, fluorine-doped dielectrics, porous dielectrics, organic polymeric dielectrics, photo-imageable dielectrics, and/or benzocyclobutene-based polymers). In some embodiments, the insulating material of a die 114 may include a semiconductor material, such as silicon, germanium, or a III-V material (e.g., gallium nitride), and one or more additional materials. For example, an insulating material may include silicon oxide or silicon nitride. The conductive pathways in a die 114 may include conductive traces and/or conductive vias, and may connect any of the conductive contacts in the die 114 in any suitable manner (e.g., connecting multiple conductive contacts on a same surface or on different surfaces of the die 114). Example structures that may be included in the dies 114 disclosed herein are discussed below with reference to FIG. 13. The conductive pathways in the dies 114 may be bordered by liner materials, such as adhesion liners and/or barrier liners, as suitable.

The package substrate 102 may include conductive pathways 119 through an insulating material. The conductive pathways 119 may couple the dies 114 to a circuit board 104 (e.g., via the first level interconnects 108 and second level interconnects 109). Any suitable arrangement of conductive pathways 119 may couple the dies 114 to each other (e.g., a conductive pathway 117 coupling die 114-1 to a die 114-3) and the dies 114 to the circuit board 104, as desired. The package substrate 102 may be an organic substrate. For example, in some embodiments, the insulating material may be an organic material, such as an epoxy-based laminate. The insulating material may be, for example, a build-up film (e.g., Ajinomoto build-up film). The insulating material may include, for example, an epoxy with a phenolic hardener. The conductive pathways may be made of any suitable conductive material, for example, copper.

The package substrate 102 may be coupled to the circuit board 104 via second level interconnects 109 at the first surface 170-1 of the package substrate 102. In some embodiments, the second level interconnects 109 may include solder balls (as illustrated in FIG. 1) for a ball grid array (BGA) coupling; in other embodiments, the second level interconnects 109 may include solder paste contacts to provide land grid array (LGA) interconnects, or any other suitable interconnect. The circuit board 104 may include conductive pathways (not shown) that allow power, ground, and other electrical signals to move between the circuit board 104 and the package substrate 102, as known in the art. Although FIG. 1 illustrates a single package substrate 102 disposed on the circuit board 104, this is simply for ease of illustration, and multiple package substrates 102 having one or more dies 114 (i.e., IC packages) may be disposed on the circuit board 104. In some embodiments, the circuit board 104 may be a printed circuit board (PCB) (e.g., a motherboard). In some embodiments, the circuit board 104 may be another IC package, and the microelectronic assembly 100 may be a package-on-package structure. In some embodiments, the circuit board 104 may be an interposer, and the microelectronic assembly 100 may be a package-on-interposer structure.

A number of elements are illustrated in FIG. 1, but a number of these elements may not be present in microelectronic assemblies disclosed herein. For example, in various embodiments, the conductive pathways 115, 118, 117, 119, the second level interconnects 109, and/or the circuit board 104 may not be included. Further, FIG. 1 illustrates a number of elements that are omitted from subsequent drawings for ease of illustration, but may be included in any of the microelectronic assemblies disclosed herein. Examples of such elements include the second level interconnects 109 and/or the circuit board 104. Many of the elements of the microelectronic assembly 100 of FIG. 1 are included in other ones of the accompanying figures; the discussion of these elements is not repeated when discussing these figures, and any of these elements may take any of the forms disclosed herein. A number of elements are not illustrated in FIG. 1, but may be present in microelectronic subassemblies disclosed herein; for example, additional integral devices 112; additional active components, such as additional dies; or additional passive components, such as surface-mount resistors, capacitors, and/or inductors, may be disposed on the top surface or the bottom surface of the package substrate 102, or embedded in the package substrate 102, and may be electrically connected by the conductive pathways in the package substrate 102.

Figure 2A:
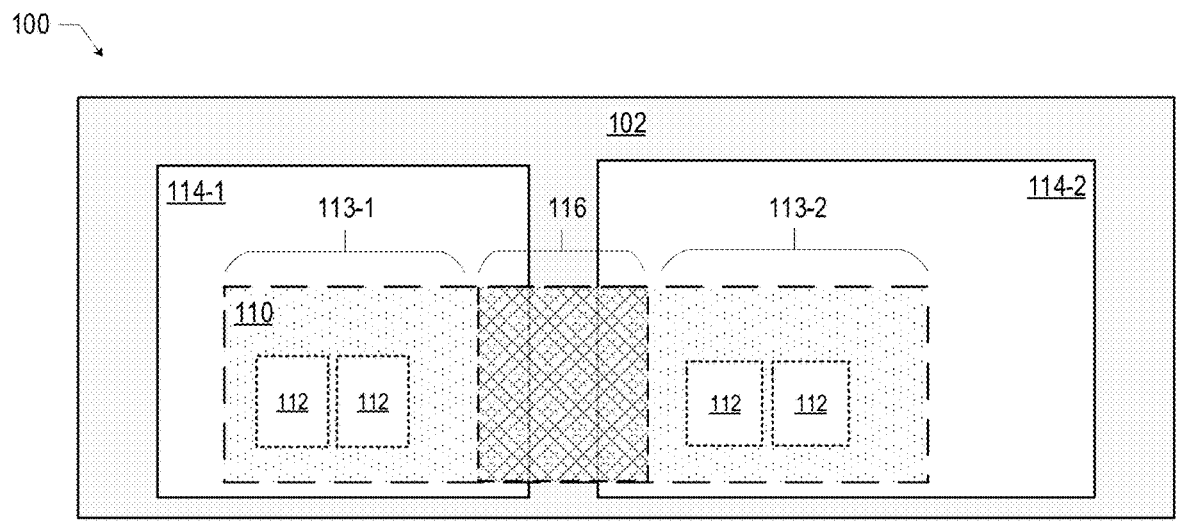
FIG. 2A is a top, transparent view of example interconnect areas of a microelectronic assembly, in accordance with various embodiments.

FIG. 2A is a top, transparent view of a microelectronic assembly 100 including a package substrate 102, a bridge 110 embedded in the package substrate 102, and multiple dies 114 disposed thereon. The bridge 110 may include different interconnect areas or regions 113, 116 for integral devices 112 and for signal routing between dies 114, respectively, in accordance with various embodiments. For example, as shown in FIG. 2A, a surface of the bridge 110 may include first and second interconnect areas 113-1, 113-2 for coupling the integral devices 112 in the bridge 110 to the dies 114-1, 114-2, respectively, and a third interconnect area 116 for conductive pathways 118 (e.g., signal traces) between the dies 114-1, 114-2. Although FIG. 2 depicts two interconnect areas or regions 113 for coupling to integral devices 112 and one interconnect region 116 for conductive pathways 118 between dies, these arrangements are simply examples. A microelectronic assembly 100 may include any suitable number of regions 113 designated for integral devices 112 as well as for integral device coupling to dies 114, and any suitable number of regions 116 designated for signal routing conductive pathways 118 between dies 114.

Figure 2B:
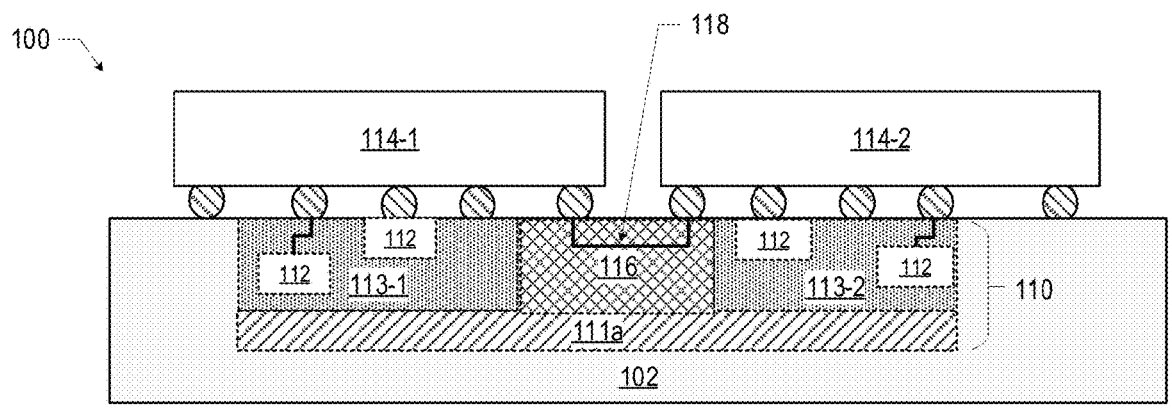
FIGS. 2B and 2C are side, cross-sectional views of example interconnect areas of the microelectronic assembly of FIG. 2A, in accordance with various embodiments.
Figure 2C:
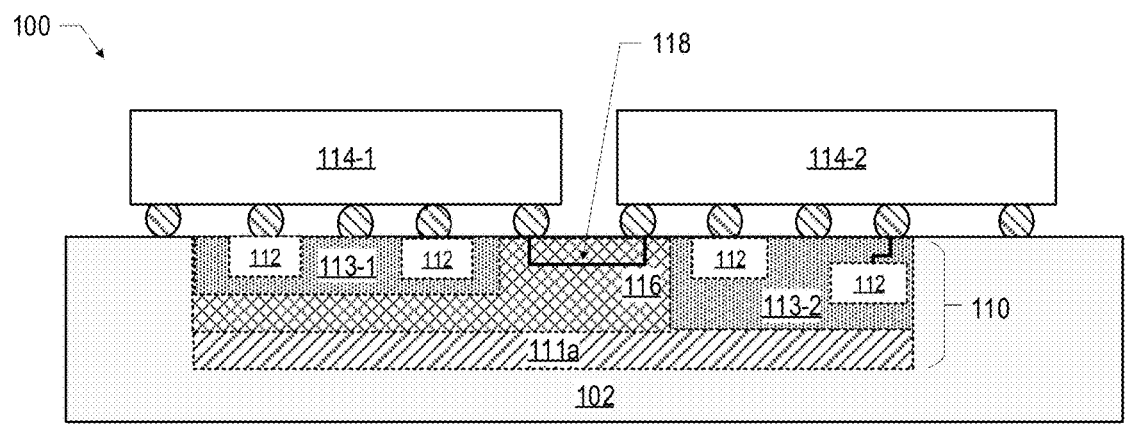

FIGS. 2B and 2C are side, cross-sectional views of example interconnect areas 113, 116 of the microelectronic assembly of FIG. 2A. As shown in FIG. 2B, the bridge 110 may include a first area 113-1, a second area 113-2, and a third area 116. The first area 113-1 may include integral devices 112 under at least a portion of the die 114-1 and a first interconnect area 113-1 at the surface of the bridge 110. The second area 113-2 may include integral devices 112 under at least a portion of the die 114-2 and a second interconnect area 113-2 at the surface of the bridge 110. The third area 116 may include conductive pathways 118 and a third interconnect area at the surface of the bridge 110, where the third area 116 is between the first and second areas 113-1, 113-2.

As shown in FIG. 2C, the bridge 110 may include a first area 113-1, a second area 113-2, and a third area 116. The first area 113-1 may include integral devices 112 under at least a portion of the die 114-1 and a first interconnect area 113-1 at the surface of the bridge 110. The second area 113-2 may include integral devices 112 under at least a portion of the die 114-2 and a second interconnect area 113-2 at the surface of the bridge 110. The third area 116 may include conductive pathways 118 and a third interconnect area at the surface of the bridge 110, where the third area 116 is between the first and second areas 113-1, 113-2 and extends under at least a portion of the first area 113-1.

Figure 3A:
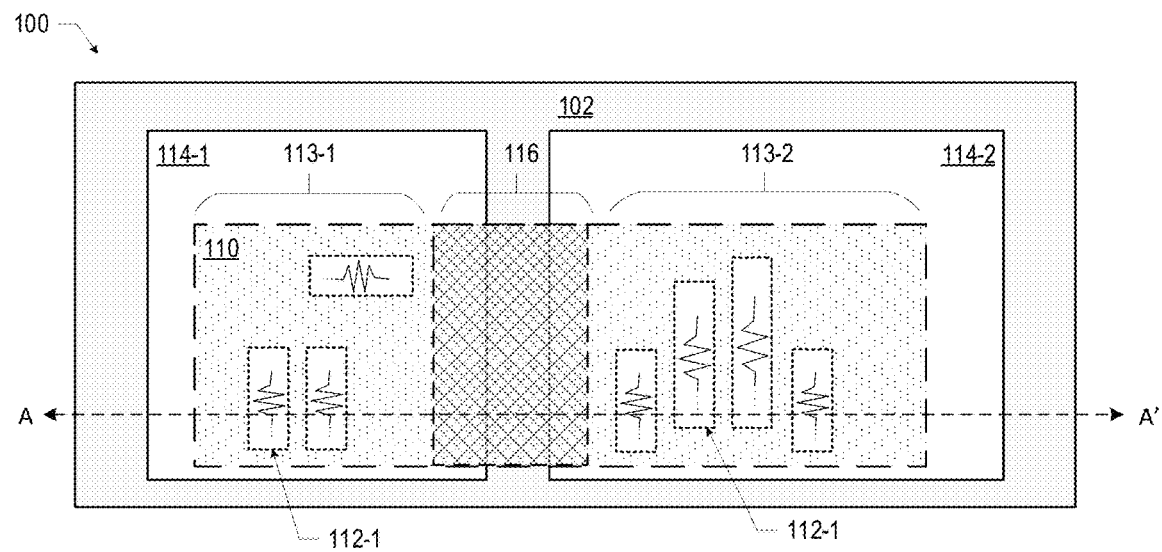
FIG. 3A is a top, transparent view of an example microelectronic assembly, in accordance with various embodiments.

FIG. 3A is a top, transparent view of an example microelectronic assembly 100 including a package substrate 102, a bridge 110 having integral devices 112, and multiple dies 114 disposed thereon. In particular, the bridge 110 may include a cTFR 112-1 as an integral device 112, in accordance with various embodiments. As shown in in FIG. 3A, the bridge 110 may include three cTFRs 112-1 in a first interconnect area 113-1 and four cTFRs 112-1 in a second interconnect area 113-2. Although FIG. 3 shows a particular number and arrangement of cTFRs 112-1, a bridge 110 may include any suitable number of cTFRs 112-1 having any suitable arrangement.

Figure 3B:
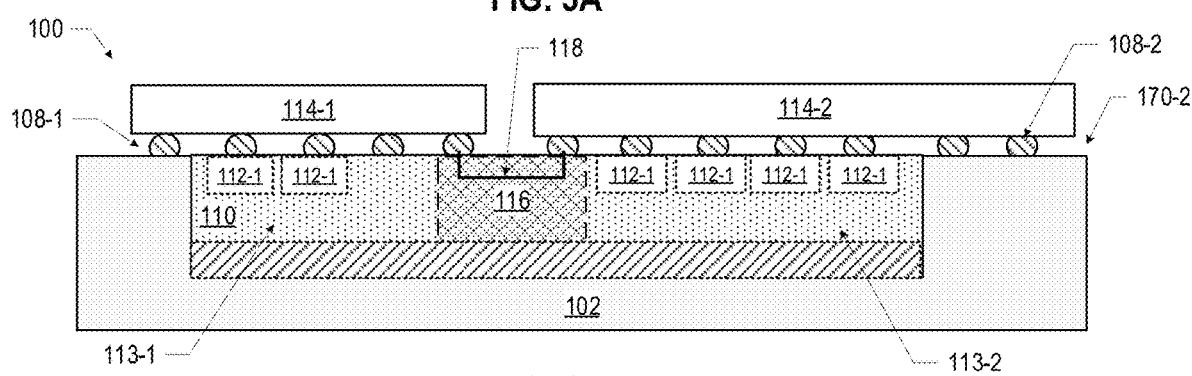
FIG. 3B is a side, cross-sectional view of the example microelectronic assembly of FIG. 3A, in accordance with various embodiments.

FIG. 3B is a side, cross-sectional view along the A-A' line of the example microelectronic assembly 100 of FIG. 3A. The microelectronic assembly 100 may include the bridge 110 having a plurality of cTFRs 112-1 at a surface of the bridge 110. The cTFRs 112-1 in a first interconnect area 113-1 may be coupled to the die 114-1 and the cTFRs 112-1 in a second interconnect area 113-2 may be coupled to the die 114-2. A third interconnect area 116 may include conductive pathways for coupling the dies 114-1 and 114-2. The cTFRs 112-1 may be coupled to conductive pathways in the dies 114-1, 114-2 via the first level interconnects 108. The dies 114-1, 114-2 may be coupled to each other via the conductive pathways in the bridge 110 and the first level interconnects 108.

Figure 3C:
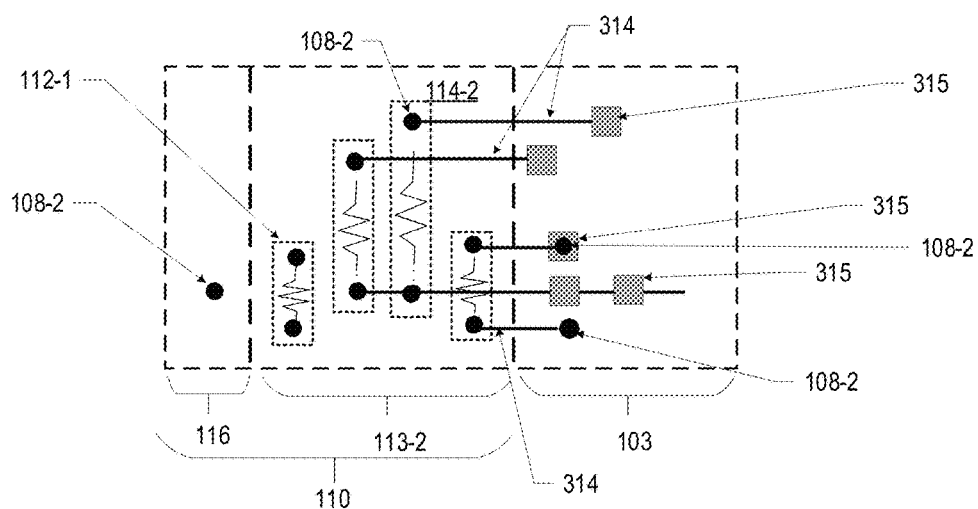
FIG. 3C is a top, transparent view of example interconnects of a die of the microelectronic assembly of FIG. 3A, in accordance with various embodiments.

FIG. 3C is a top, transparent view showing example conductive connections of the die 114-2 of the microelectronic assembly 100 of FIG. 3A, in accordance with various embodiments. In particular, FIG. 3C shows the first level interconnects 108-2 (e.g., as depicted by the black circles) at the second surface 170-2 of the package substrate 102 coupling the die 114-2 to the bridge 110 and to the package substrate 102. The die 114-2 may include an integral device interconnect area 113-2 (e.g., the second interconnect area of FIG. 3A), a signal interconnect area 116, and a package substrate interconnect area 103. The die 114-2 may be coupled to conductive pathways (e.g., conductive pathway 118 of FIG. 3B) in the bridge 110 via the first level interconnects 108-2 in the signal interconnect area 116. The die 114-2 may be coupled to the cTFRs 112-1 in the bridge 110 via the first level interconnects 108-2 in the integral device interconnect area 113-2. The cTFRs 112-1 in the bridge 110 may be coupled to conductive pathways 314 in other metallization layers of the die 114-2 by vias 315 (e.g., as depicted by the gray squares) to the next conductive layer (e.g., an upper metallization layer). The conductive pathways 314 in the die 114-2 may be a ground, a power, or a signal connection. In some embodiments, a cTFR 112-1 may be coupled to one ground connection and one signal connection. The die 114-2 may be coupled to the package substrate 102 via the first level interconnects 108-2 in the package substrate interconnect area 103.

Figure 4A:
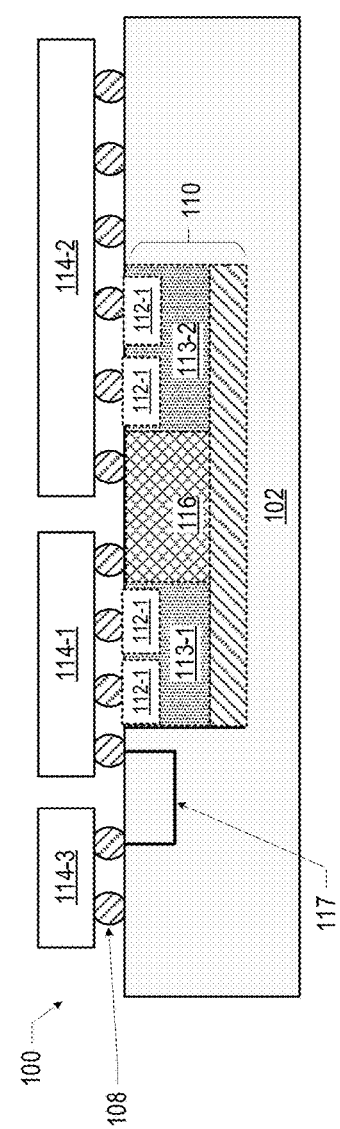
FIG. 4A is a side, cross-sectional view of an example microelectronic assembly, in accordance with various embodiments.

FIG. 4A is a cross-sectional side view of a microelectronic assembly 100 including a package substrate 102, a bridge 110 embedded in the package substrate 102, and multiple dies 114-1, 114-2, 114-3 disposed thereon. In particular, the bridge 110 may include one or more integral devices, such as cTFRs 112-1, in a first region 113-1 under the first die 114-1 and in a second region 113-2 under the second die 114-2. The bridge 110 may further include a third region 116 having conductive pathways (not shown) between the first and second dies 114-1, 114-2. The first and second dies 114-1, 114-2 may be coupled directly to the bridge 110 and the package substrate 102 via first level interconnects 108. The third die 114-3 may be coupled directly to the package substrate via first level interconnects 108.

Figure 4B:
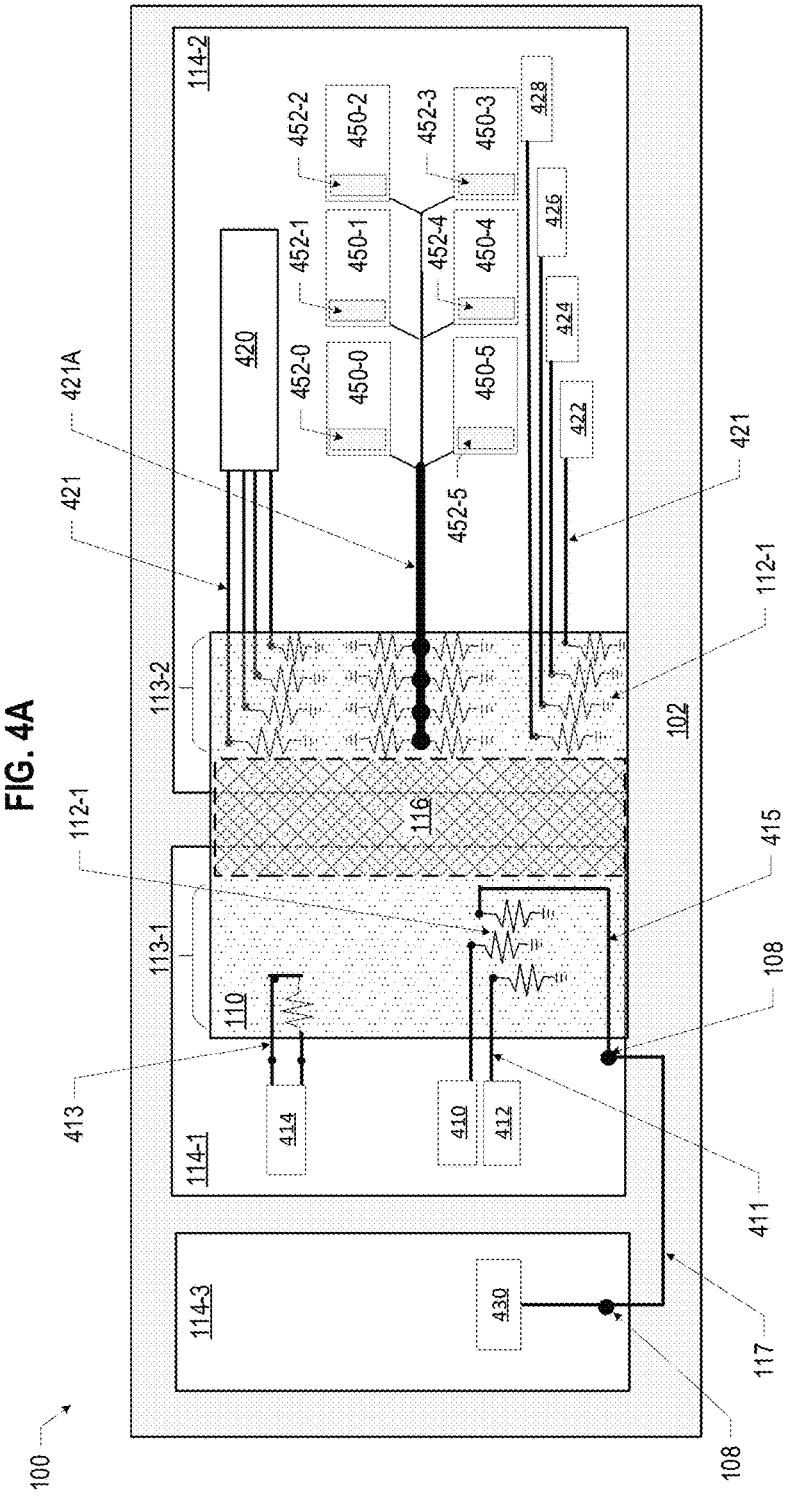
FIG. 4B is a top, transparent view of example interconnects of the example microelectronic assembly of FIG. 4A, in accordance with various embodiments.

FIG. 4B is top, transparent view of an example architecture of the microelectronic assembly 100 of FIG. 4A, in accordance with various embodiments. The microelectronic assembly 100 may include a first die 114-1 and a second die 114-2 coupled to a bridge 110 embedded in a package substrate 102, and a third die 114-3 coupled to the package substrate 102. The bridge 110 may include one or more cTFRs 112-1 for improved calibration of a circuit as described in detail below with reference to FIGS. 5 and 6, in accordance with various embodiments. As shown in FIG. 4B, the first die 114-1 may include two circuits 410, 412, coupled to cTFRs 112-1 in the first region 113-1 of the bridge 110 via first level interconnects 108 and conductive pathways 411 in the die 114-1. The first die 114-1 may further include a third circuit 414 coupled to a differential cTFR 112-1 in the first region 113-1 of the bridge 110 via first level interconnects and conductive pathways 413 in the first die 114-1. The first die 114-1 may further include calibration logic (not shown) for performing calibration of the circuits 410, 412, 414 with the respective cTFRs 112-1. In some embodiments, the first die 114-1 is a GPU.

The second die 114-2 may include a plurality of cores or computation logic blocks 450 and a plurality of electrical components 420, 422, 424, 426, 428. An individual core 450 may include an integrated voltage regulator/power gate 452. An individual core 450 may be coupled to a respective individual cTFR 112-1 in the second region 113-2 of the bridge 110 via conductive pathways 421 in the second die 114-2. Each individual core may be coupled to an individual cTFR 112-1 as indicated by the thicker line 421A connecting the respective cores 450 to a respective cTFR 112-1. The electrical components 420, 422, 424, 426, 428 may be coupled to the cTFRs 112-1 in the second region 113-2 of the bridge 110 via conductive pathways 421 in the second die 114-2. As shown in FIG. 4B, a component may be coupled to one or more cTFRs 112-1. In some embodiments, a component, such as component 420, may be coupled to more than one cTFR 112-1, where the component may include more than one circuit and an individual circuit may be coupled to a respective individual cTFR 112-1. In some embodiments, a component, such as components 422, 424, 426, and 428, may have one individual circuit coupled to a respective individual cTFR 112-1. In some embodiments, the electrical components 420, 422, 424, 426, 428 may include high-speed input/output circuits, such as a double data rate (DDR) memory interface, a differential I/O interface (e.g., a Peripheral Component Interconnect Express (PCIE)), or a display interface. The second die 114-2 may further include calibration logic (not shown) for performing calibration of the circuits of the electrical components 420, 422, 424, 426, 428 and the cores 450 with the respective cTFRs 112-1. In some embodiments, the second die 114-2 is a CPU, or other processing unit with core logic and input/output interface circuits.

In some embodiments, a die may be indirectly coupled to an integral component in a bridge. For example, as shown in FIG. 4B, the third die 114-3 may include a circuit 430 that may be coupled to, and calibrated by, the cTFR 112-1 in the bridge 110, where the third die 114-3 is indirectly coupled to the bridge via the first die 114-1 (e.g., the third die 114-3 is not directly coupled to the bridge 110 via first level interconnects 108). In particular, the circuit 430 in the third die 114-3 may be coupled to the cTFR 112-1 in the bridge 110 via conductive pathways 415 in the first die 114-1, the first level interconnect 108, and the conductive pathways 117 in the package substrate 102. The first die 114-1 and/or the third die 114-3 may further include calibration logic (not shown) for performing calibration of the circuit 430 with the respective cTFR 112-1. In some embodiments, the third die 114-3 is a PCH.

Figure 5:
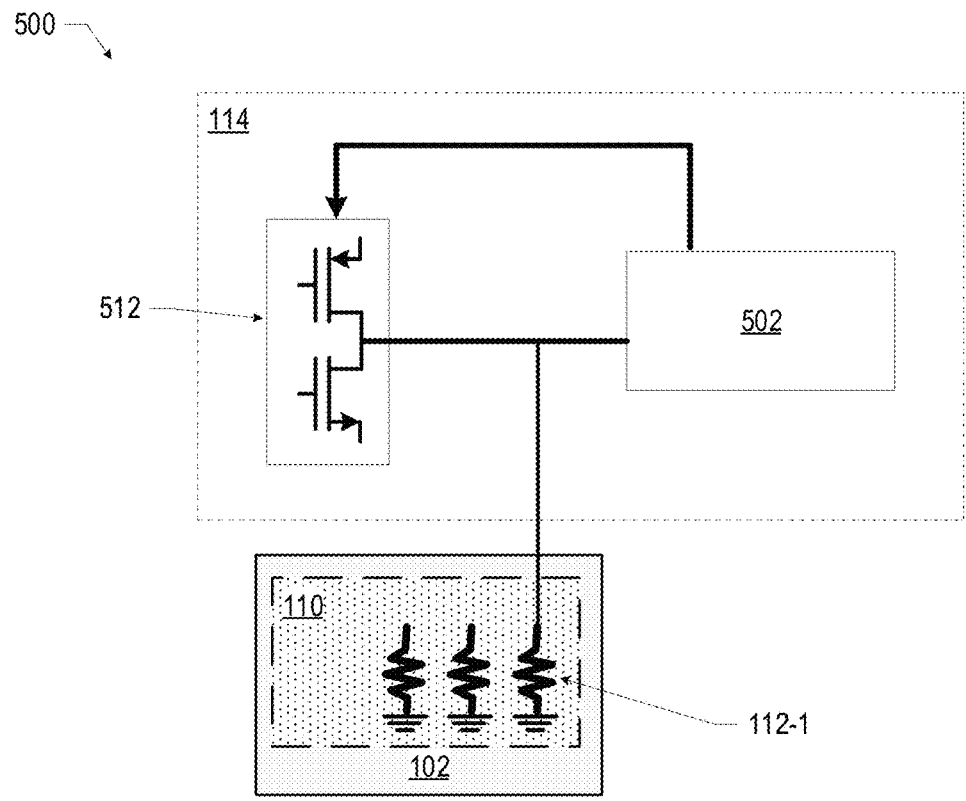
FIG. 5 is an example architecture of a microelectronic assembly, in accordance with various embodiments.

FIG. 5 is an example architecture of a calibration circuit 500 in a microelectronic assembly, in accordance with various embodiments. The microelectronic assembly may include a die 114 coupled to a bridge 110 embedded in a package substrate 102. The bridge 110 may include, as integral devices, one or more cTFRs 112-1 having a known resistance. The die 114 may include a calibration module 502 and a buffer 512 having a plurality of transistors connected in parallel. The calibration module 502 may include a hardware processor, memory, circuitry, and logic to filter and detect resistance in the circuit. The calibration module 502 may be coupled to the buffer 512 and the cTFR 112-1 in the bridge 110. Based on the known voltage of the circuit and the known resistance of the cTFR 112-1, the calibration module 502 may determine the number of transistors to connect in parallel to achieve a target resistance in the buffer 512.

Figure 6:
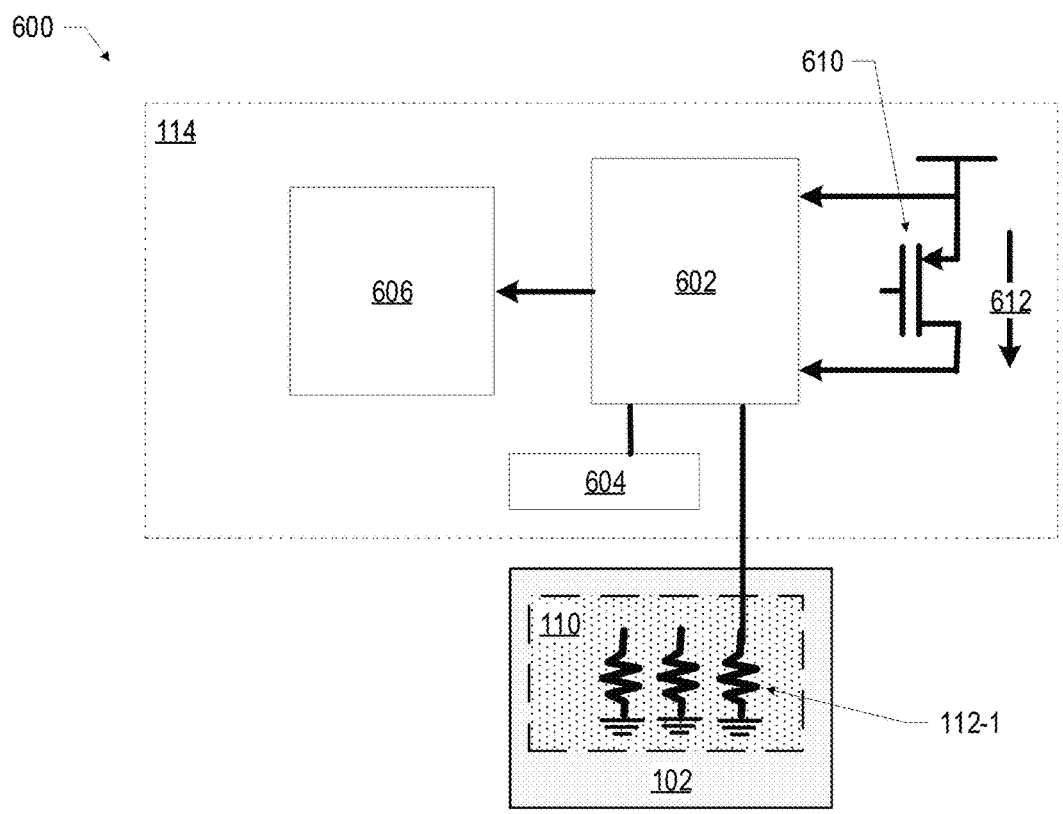
FIG. 6 is another example architecture of a microelectronic assembly, in accordance with various embodiments.

FIG. 6 is another example architecture of a calibration circuit 600 in a microelectronic assembly, in accordance with various embodiments. The microelectronic assembly may include a die 114 coupled to a bridge 110 embedded in a package substrate 102. The bridge 110 may include, as integral devices, one or more cTFRs 112-1 having a known resistance. The die 114 may include a calibration module 602, a transistor 610, and an on-die band gap reference voltage 604. The calibration module 602 may be coupled to the on-die band gap reference voltage 604, the cTFR 112-1 in the bridge 110, and the transistor 610. The calibration module 602 may measure voltage 612 across the transistor 610 and may determine a current of the circuit. The die 114, optionally, may include a circuit management module 606 coupled to the calibration module 602. The circuit management module 606 may compare the determined current of the circuit to a target value, and, based on a variance between the determined current and the target current, may adjust the circuit parameters (e.g., by changing signal or clock frequency) to meet the target current. In some embodiments, the circuit management module 606 may determine the current of the circuit based on the voltage 612 measured by the calibration module 602. The calibration module 602 may include a hardware processor, memory, circuitry, and logic to filter and detect voltage 612 in the circuit. The circuit management module 606 may include a hardware processor, memory, circuitry, and logic to adjust the circuit parameters to meet target values or may simply report measurements.

Figure 7A:
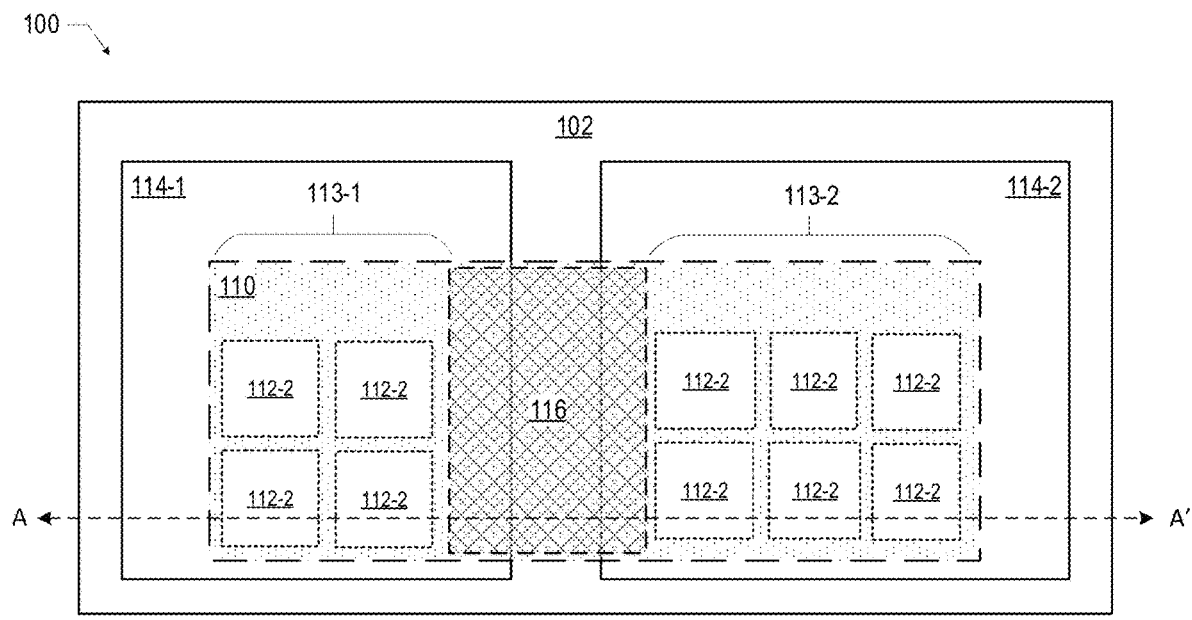
FIG. 7A is a top, transparent view of an example microelectronic assembly, in accordance with various embodiments.

FIG. 7A is a top, transparent view of an example microelectronic assembly 100 including a package substrate 102, a bridge 110 having integral devices 112, and multiple dies 114 disposed thereon. In particular, the bridge 110 may include a capacitor 112-2 as an integral device 112 for reducing RFI and/or EMI in the microelectronic assembly 100, in accordance with various embodiments. In some embodiments, the capacitor 112-2 is a plurality of capacitors. In some embodiments, the plurality of capacitors 112-2 are arranged in an array. As shown in FIG. 7A, the bridge 110 may include an array of four capacitors 112-2 in a first interconnect area 113-1 and an array of six capacitors 112-2 in a second interconnect area 113-2. Although FIG. 7 shows a particular number and arrangement of capacitors 112-2, a bridge 110 may include any suitable number of capacitors 112-2 having any suitable arrangement. In some embodiments, the capacitors 112-2 may not be arranged in an array.

Figure 7B:
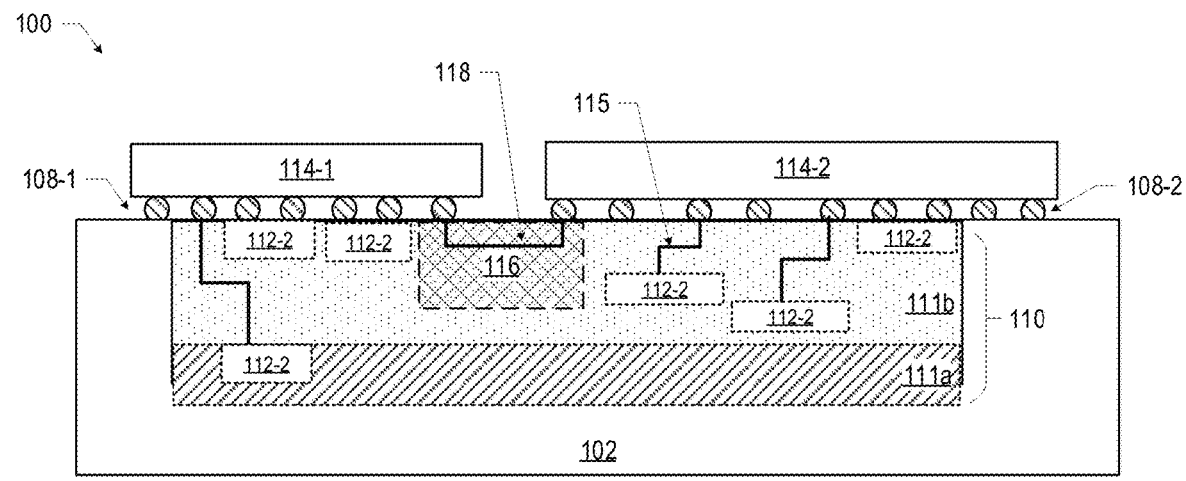
FIG. 7B is a side, cross-sectional view of the example microelectronic assembly of FIG. 7A, in accordance with various embodiments.

FIG. 7B is a side, cross-sectional view along the A-A' line of the example microelectronic assembly 100 of FIG. 7A. The microelectronic assembly 100 may include the bridge 110 having a plurality of capacitors 112-2, where the capacitors 112-2 may be arranged in different layers within the routing layers 111b (e.g., at a surface of the bridge 110 and/or within one or more routing layers of the bridge 110). In some embodiments, the substrate 111a of the bridge 110 may include the capacitors 112-2. In some embodiments, the capacitors 112-2 in the substrate 111a of the bridge 110 may include an array of MOS capacitors. The capacitors 112-2 in a first interconnect area 113-1 may be coupled to the die 114-1 via first level interconnects 108-1, and the capacitors 112-2 in a second interconnect area 113-2 may be coupled to the die 114-2 via first level interconnects 108-2 and conductive pathways 115 in the bridge 110. A third interconnect area 116 may include conductive pathways 118 for coupling the die 114-1 and the die 114-2. The capacitor 112-2 may be any suitable capacitor, including, for example, a trench capacitor, a metal-insulator-metal (MIM) capacitor, or a MOS capacitor. The capacitor 112-2 may be made of any suitable material, and may be made of the same material as the bridge 110.

Figure 8A:
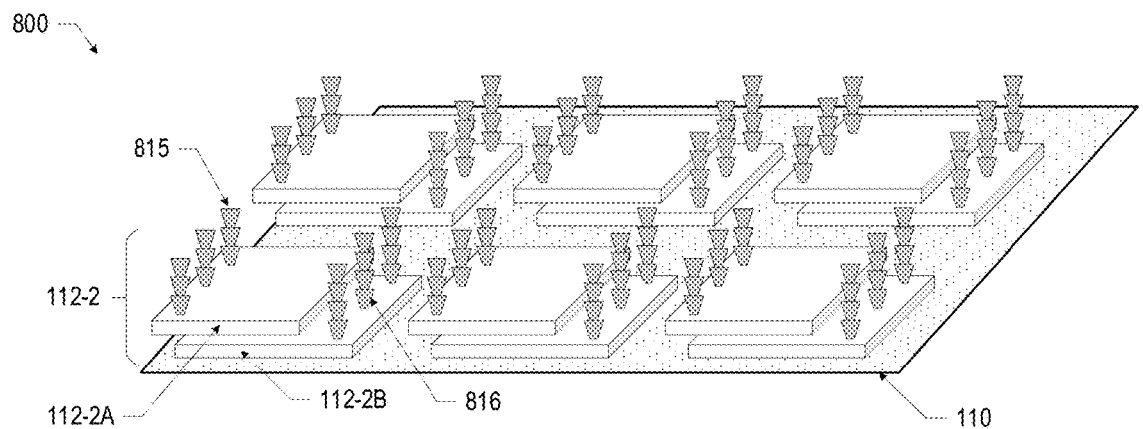
FIG. 8A is a perspective view of an example integral device in a microelectronic assembly, in accordance with various embodiments.

FIG. 8A is a perspective view of a portion of an example microelectronic assembly 800 including an array of six capacitors 112-2 as integral devices in a bridge 110, in accordance with various embodiments. As shown in FIG. 8A, an individual capacitor 112-2 may include a first conductive plate 112-2A and a second conductive plate 112-2B with a dielectric material (not shown) between the two conductive plates (e.g., a MIM capacitor). In some embodiments, the first conductive plate 112-2A may be a power plate and the second conductive plate 112-2B may be a ground plate.

Figure 8B:
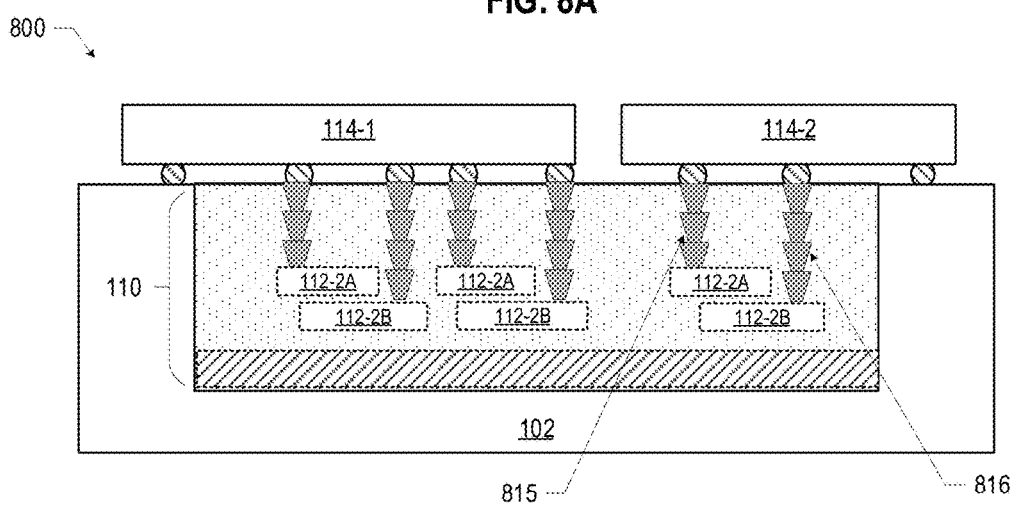
FIG. 8B is a side, cross-sectional view of an example microelectronic assembly including the device of FIG. 8A, in accordance with various embodiments.

FIG. 8B is a side, cross-sectional view of the example microelectronic assembly 800, in accordance with various embodiments. As shown in FIG. 8B, the first and second conductive plates 112-2A, 112-2B may be coupled to a die 114 at a surface of the bridge by conductive pathways in the bridge 110. In particular, the first conductive plate 112-2A may be coupled to a die 114 by vias 815 in the bridge 110 and the second conductive plate 112-2B may be coupled to a die 114 by vias 816 in the bridge 110.

Figure 8C:
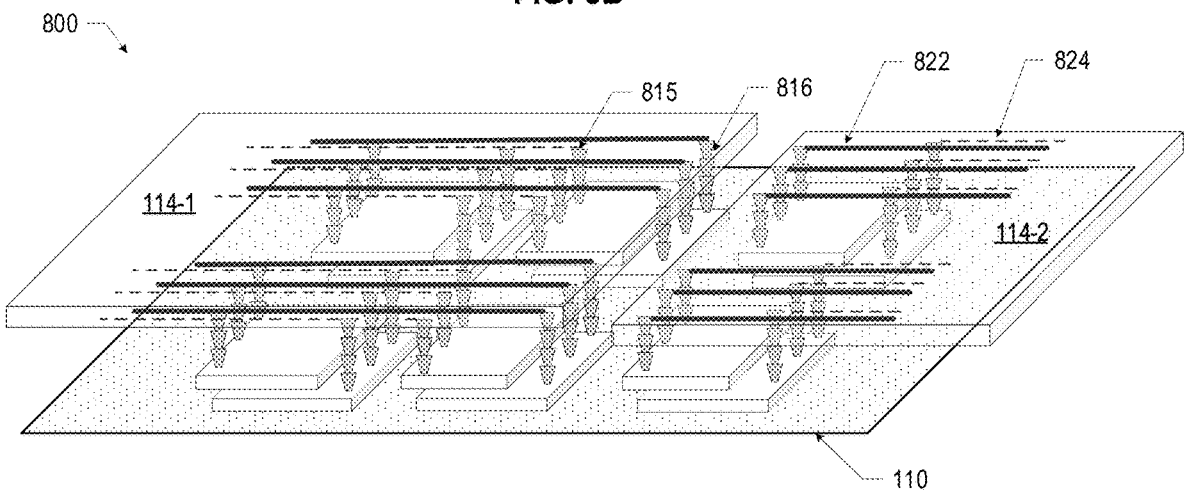
FIG. 8C is a perspective, transparent view of example interconnects of the integral device of the microelectronic assembly of FIG. 8B, in accordance with various embodiments.

FIG. 8C is a perspective, transparent view of the microelectronic assembly 800 of FIG. 8A showing the array of capacitors 112-2 in the bridge 110 coupled to dies 114-1, 114-2, in accordance with various embodiments. As shown in FIG. 8C, a first die 114-1 may be coupled to an array of four capacitors 112-2 and a second die 114-2 may be coupled to an array of two capacitors 112-2. An individual capacitor 112-2 may include a first conductive plate 112-2A coupled to the die 114 by vias 815 and conductive pathways 822 in the die 114, and a second conductive plate 112-2B coupled to the die 114 by vias 816 and conductive pathways 824 in the die 114. In some embodiments, the conductive pathways 822 are coupled to a power source and the conductive pathways 824 are coupled to a ground source.

Figure 9A:
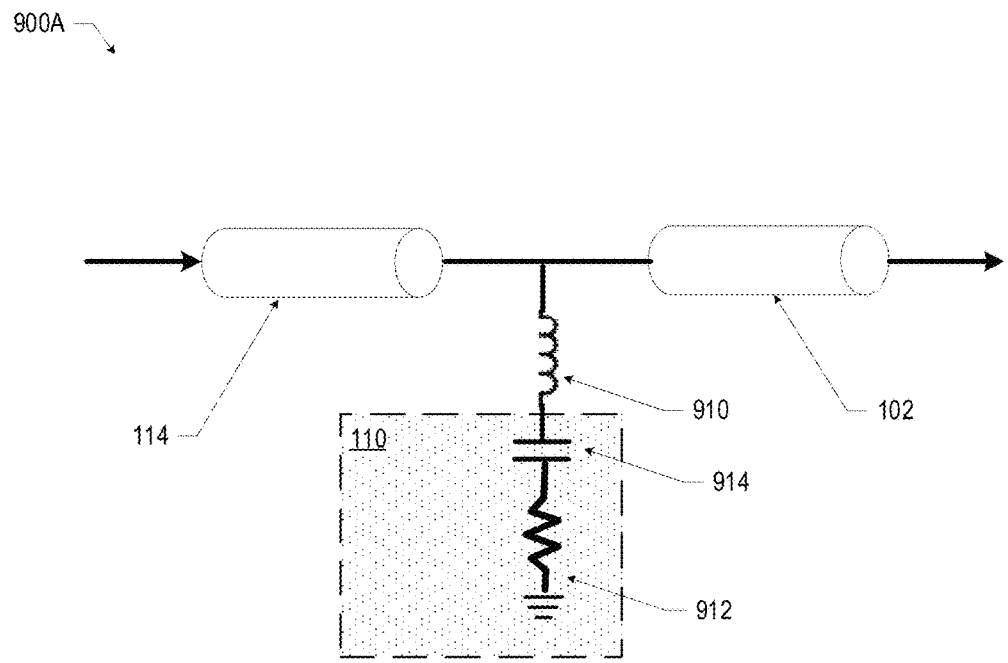
FIGS. 9A and 9B are schematics of example architectures of a microelectronic assembly, in accordance with various embodiments.

FIG. 9A is a schematic of an example architecture of a microelectronic assembly 900A, in accordance with various embodiments. The microelectronic assembly 900A may include a die 114, a package substrate 102, and a bridge 110 embedded in the package substrate 102, where the bridge 110 includes an array of capacitors 914 as integral devices. The die 114 may be coupled to the package substrate 102 via the capacitor 914, a parasitic resistance 912, and/or a parasitic inductance 910 in the bridge 110. The die 114 may be a source of RF noise and may introduce RFI and/or EMI into a signal. By coupling the die 114 to one or more capacitors 914 (e.g., an array of capacitors 914) in the bridge 110, the RFI and/or EMI may be mitigated (e.g., absorbed) before reaching the package substrate 102 and/or circuit board (not shown). In some embodiments, the array of capacitors 914 in the bridge 110 may function as a tunable notch filter where a frequency may be adjusted based on the number of capacitors in the array of capacitors 914 on the bridge that are connected to the die 114, or based on the number of connections to alter the parasitic inductance 910.

Figure 9B:
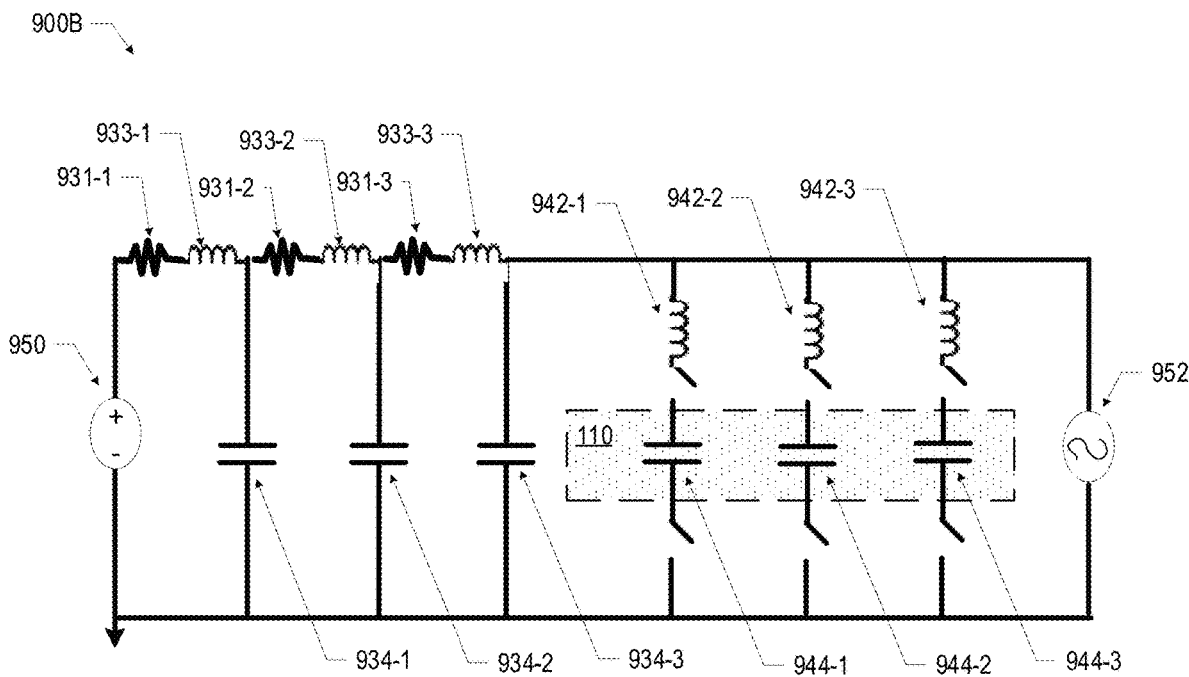

FIG. 9B is a schematic of an example architecture of a circuit 900B of an example microelectronic assembly, in accordance with various embodiments. As shown in FIG. 9B, the circuit 900B may include architecture for a power delivery network having a high-frequency current 952, generated in a switching circuit on a die (e.g., die 114 in FIG. 9A), injected into the power delivery network. The circuit 900B may include a plurality of capacitors 944-1, 944-2, 944-3, and a plurality of parasitic inductances 942-1, 942-2, 942-3 that may be connected, respectively, as depicted in FIG. 9A, between the switching circuits on the die 114 and the power delivery network on the package substrate 102 and/or a circuit board (not shown). The power delivery network on a circuit board and/or a package substrate 102 may include a voltage regulator 950, power plane parasitic inductances 933-1, 933-2, 933-3, parasitic resistances 931-1, 931-2, 931-3, and decoupling capacitors 934-1, 934-2, 934-3. The plurality of capacitors 944-1, 944-2, 944-3 may be integral devices in the bridge 110, and with the respective plurality of inductors 942-1, 942-2, 942-3 may form notch filters (e.g., as described above with reference to FIG. 9A) to provide a low impedance path for the high-frequency current 952, such that the power delivery network to the package substrate 102 and/or circuit board may not be subjected to the high-frequency current and the EMI and/or RFI to the package substrate and/or circuit board may be mitigated.

The microelectronic assemblies disclosed herein may be included in any suitable electronic component. FIGS. 10-13 illustrate various examples of apparatuses that may include, or be included in, any of the microelectronic assemblies disclosed herein.

Figure 10:
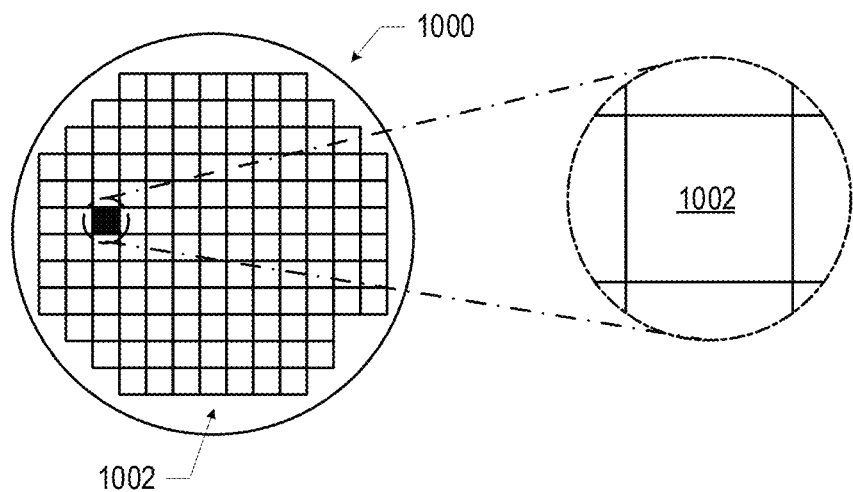
FIG. 10 is a top view of a wafer and dies that may be included in a microelectronic assembly, in accordance with any of the embodiments disclosed herein.

FIG. 10 is a top view of a wafer 1000 and dies 1002 that may be included in any of the microelectronic assemblies disclosed herein (e.g., any of the dies 114 disclosed herein). The wafer 1000 may be composed of semiconductor material and may include one or more dies 1002 having IC structures formed on a surface of the wafer 1000. Each of the dies 1002 may be a repeating unit of a semiconductor product that includes any suitable IC. After the fabrication of the semiconductor product is complete, the wafer 1000 may undergo a singulation process in which the dies 1002 are separated from one another to provide discrete "chips" of the semiconductor product. The die 1002 may be any of the dies 114 disclosed herein. The die 1002 may include one or more transistors (e.g., some of the transistors 1140 of FIG. 11, discussed below), supporting circuitry to route electrical signals to the transistors, passive components (e.g., signal traces, resistors, capacitors, or inductors), and/or any other IC components. In some embodiments, the wafer 1000 or the die 1002 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1002. For example, a memory array formed by multiple memory devices may be formed on a same die 1002 as a processing device (e.g., the processing device 1402 of FIG. 13) or other logic that is configured to store information in the memory devices or execute instructions stored in the memory array. Various ones of the microelectronic assemblies disclosed herein may be manufactured using a die-to-wafer assembly technique in which some dies are attached to a wafer 1000 that includes others of the dies, and the wafer 1000 is subsequently singulated.

Figure 11:
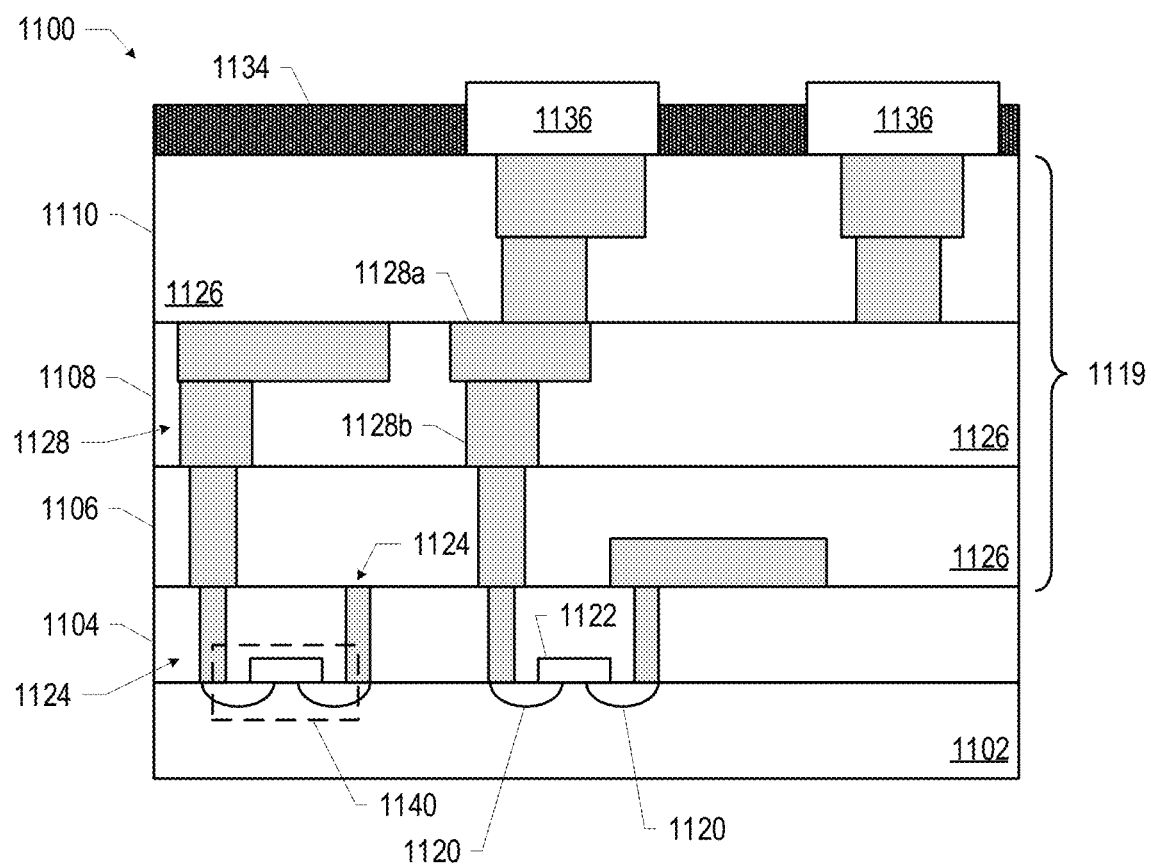
FIG. 11 is a cross-sectional side view of an integrated circuit device that may be included in a microelectronic assembly, in accordance with any of the embodiments disclosed herein.

FIG. 11 is a cross-sectional side view of an example IC device 1100 that may be included in any of the microelectronic assemblies disclosed herein (e.g., in any of the dies 114). One or more of the IC devices 1100 may be included in one or more dies 1002 (FIG. 10). The IC device 1100 may be formed on a substrate 1102 (e.g., the wafer 1000 of FIG. 10) and may be included in a die (e.g., the die 1002 of FIG. 10). The substrate 1102 may be a semiconductor substrate composed of semiconductor material systems including, for example, n-type or p-type materials systems (or a combination of both). The substrate 1102 may include, for example, a crystalline substrate formed using a bulk silicon or a silicon-on-insulator (SOI) substructure. In some embodiments, the substrate 1102 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1102. Although a few examples of materials from which the substrate 1102 may be formed are described here, any material that may serve as a foundation for an IC device 1100 may be used. The substrate 1102 may be part of a singulated die (e.g., the dies 1002 of FIG. 10) or a wafer (e.g., the wafer 1000 of FIG. 10).

The IC device 1100 may include one or more device layers 1104 disposed on the substrate 1102. The device layer 1104 may include features of one or more transistors 1140 (e.g., metal oxide semiconductor field-effect transistors (MOSFETs)) formed on the substrate 1102 and/or any other active and/or passive circuitry as may be desired by a device manufacturer. The device layer 1104 may include, for example, one or more source and/or drain (S/D) regions 1120, a gate 1122 to control current flow in the transistors 1140 between the S/D regions 1120, and one or more S/D contacts 1124 to route electrical signals to/from the S/D regions 1120. The transistors 1140 may include additional features not depicted for the sake of clarity, such as device isolation regions, gate contacts, and the like. The transistors 1140 are not limited to the type and configuration depicted in FIG. 11 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1140 may include a gate 1122 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1140 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1140 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1120 may be formed within the substrate 1102 adjacent to the gate 1122 of each transistor 1140. The S/D regions 1120 may be formed using an implantation/diffusion process or an etching/deposition process, for example. In the former process, dopants such as boron, aluminum, antimony, phosphorous, or arsenic may be ion-implanted into the substrate 1102 to form the S/D regions 1120. An annealing process that activates the dopants and causes them to diffuse farther into the substrate 1102 may follow the ion-implantation process. In the latter process, the substrate 1102 may first be etched to form recesses at the locations of the S/D regions 1120. An epitaxial deposition process may then be carried out to fill the recesses with material that is used to fabricate the S/D regions 1120. In some implementations, the S/D regions 1120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1120 may be formed using one or more alternate semiconductor materials such as germanium or a group III-V material or alloy. In further embodiments, one or more layers of metal and/or metal alloys may be used to form the S/D regions 1120.

Electrical signals, such as power and/or I/O signals, may be routed to and/or from the devices (e.g., transistors 1140) of the device layer 1104 through one or more interconnect layers disposed on the device layer 1104 (illustrated in FIG. 11 as interconnect layers 1106, 1108, and 1110). For example, electrically conductive features of the device layer 1104 (e.g., the gate 1122 and the S/D contacts 1124) may be electrically coupled with interconnect structures 1128 of the interconnect layers 1106-1110. The one or more interconnect layers 1106-1110 may form a metallization stack (also referred to as an "ILD stack") 1119 of the IC device 1100.

The interconnect structures 1128 may be arranged within the interconnect layers 1106-1110 to route electrical signals according to a wide variety of designs. In particular, the arrangement is not limited to the particular configuration of interconnect structures 1128 depicted in FIG. 11. For example, the interconnect structures may be arranged as multidirectional interconnect structures. Although a particular number of interconnect layers 1106-1110 is depicted in FIG. 11, embodiments of the present disclosure include IC devices having more or fewer interconnect layers than depicted.

In some embodiments, the interconnect structures 1128 may include lines 1128a and/or vias 1128b filled with an electrically conductive material such as a metal. The lines 1128a may be arranged to route electrical signals in a direction of a plane that is substantially parallel with a surface of the substrate 1102 upon which the device layer 1104 is formed. For example, the lines 1128a may route electrical signals in a direction in and out of the page from the perspective of FIG. 11. The vias 1128b may be arranged to route electrical signals in a direction of a plane that is substantially perpendicular to the surface of the substrate 1102 upon which the device layer 1104 is formed. In some embodiments, the vias 1128b may electrically couple lines 1128a of different interconnect layers 1106-1110 together.

The interconnect layers 1106-1110 may include a dielectric material 1126 disposed between the interconnect structures 1128, as shown in FIG. 11. In some embodiments, the dielectric material 1126 disposed between the interconnect structures 1128 in different ones of the interconnect layers 1106-1110 may have different compositions; in other embodiments, the composition of the dielectric material 1126 between different interconnect layers 1106-1110 may be the same.

A first interconnect layer 1106 (referred to as Metal 1 or "M1") may be formed directly on the device layer 1104. In some embodiments, the first interconnect layer 1106 may include lines 1128a and/or vias 1128b, as shown. The lines 1128a of the first interconnect layer 1106 may be coupled with contacts (e.g., the S/D contacts 1124) of the device layer 1104.

A second interconnect layer 1108 (referred to as Metal 2 or "M2") may be formed directly on the first interconnect layer 1106. In some embodiments, the second interconnect layer 1108 may include vias 1128b to couple the lines 1128a of the second interconnect layer 1108 with the lines 1128a of the first interconnect layer 1106. Although the lines 1128a and the vias 1128b are structurally delineated with a line within each interconnect layer (e.g., within the second interconnect layer 1108) for the sake of clarity, the lines 1128a and the vias 1128b may be structurally and/or materially contiguous (e.g., simultaneously filled during a dual damascene process) in some embodiments.

A third interconnect layer 1110 (referred to as Metal 3 or "M3") (and additional interconnect layers, as desired) may be formed in succession on the second interconnect layer 1108 according to similar techniques and configurations described in connection with the second interconnect layer 1108 or the first interconnect layer 1106. In some embodiments, the interconnect layers that are "higher up" in the metallization stack 1119 in the IC device 1100 (i.e., farther away from the device layer 1104) may be thicker.

The IC device 1100 may include a solder resist material 1134 (e.g., polyimide or similar material) and one or more conductive contacts 1136 formed on the interconnect layers 1106-1110. In FIG. 11, the conductive contacts 1136 are illustrated as taking the form of bond pads. The conductive contacts 1136 may be electrically coupled with the interconnect structures 1128 and configured to route the electrical signals of the transistor(s) 1140 to other external devices. For example, solder bonds may be formed on the one or more conductive contacts 1136 to mechanically and/or electrically couple a chip including the IC device 1100 with another component (e.g., a circuit board). The IC device 1100 may include additional or alternate structures to route the electrical signals from the interconnect layers 1106-1110; for example, the conductive contacts 1136 may include other analogous features (e.g., posts) that route the electrical signals to external components.

In embodiments in which the IC device 1100 is a double-sided die (e.g., like the die 114), the IC device 1100 may include another metallization stack (not shown) on the opposite side of the device layer(s) 1104. This metallization stack may include multiple interconnect layers as discussed above with reference to the interconnect layers 1106-1110, to provide conductive pathways (e.g., including conductive lines and vias) between the device layer(s) 1104 and additional conductive contacts (not shown) on the opposite side of the IC device 1100 from the conductive contacts 1136.

Figure 12:
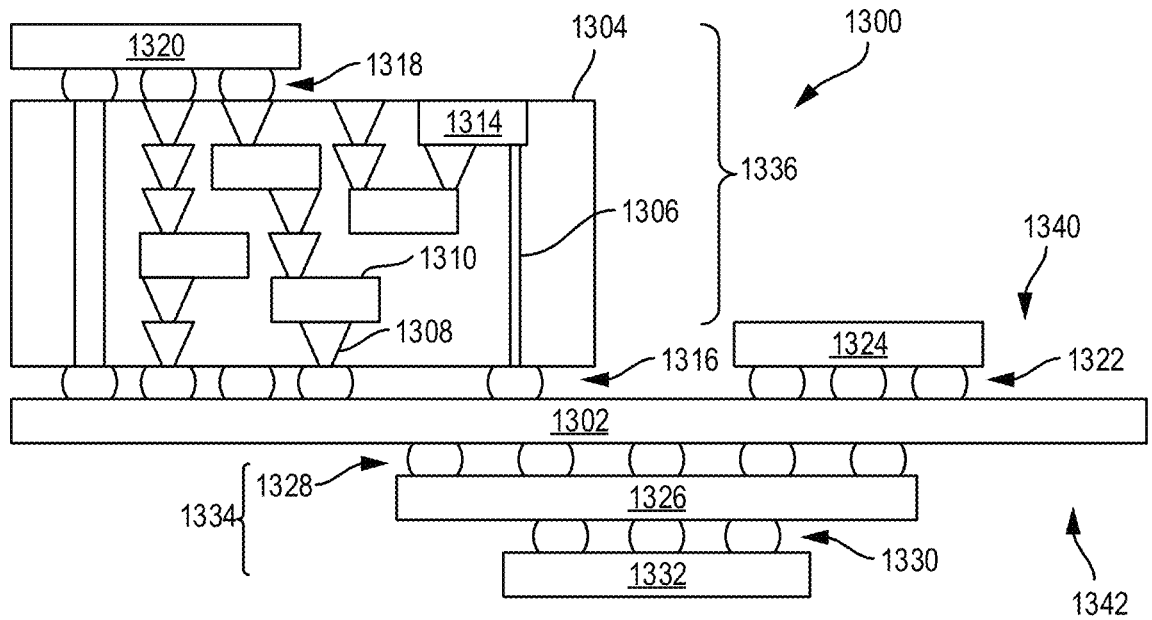
FIG. 12 is a cross-sectional side view of an integrated circuit device assembly that may include a microelectronic assembly, in accordance with any of the embodiments disclosed herein.

FIG. 12 is a cross-sectional side view of an IC device assembly 1300 that may include any of the microelectronic assemblies disclosed herein. In some embodiments, the IC device assembly 1300 may be a microelectronic assembly 100. The IC device assembly 1300 includes a number of components disposed on a circuit board 1302 (which may be, e.g., a motherboard). The IC device assembly 1300 includes components disposed on a first surface 1340 of the circuit board 1302 and an opposing second surface 1342 of the circuit board 1302; generally, components may be disposed on one or both surfaces 1340 and 1342. Any of the IC packages discussed below with reference to the IC device assembly 1300 may take the form of any suitable ones of the embodiments of the microelectronic assemblies disclosed herein.

In some embodiments, the circuit board 1302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1302. In other embodiments, the circuit board 1302 may be a non-PCB substrate.

The IC device assembly 1300 illustrated in FIG. 12 includes a package-on-interposer structure 1336 coupled to the first surface 1340 of the circuit board 1302 by coupling components 1316. The coupling components 1316 may electrically and mechanically couple the package-on-interposer structure 1336 to the circuit board 1302, and may include solder balls (as shown in FIG. 12), male and female portions of a socket, an adhesive, an underfill material, and/or any other suitable electrical and/or mechanical coupling structure.

The package-on-interposer structure 1336 may include an IC package 1320 coupled to an interposer 1304 by coupling components 1318. The coupling components 1318 may take any suitable form for the application, such as the forms discussed above with reference to the coupling components 1316. Although a single IC package 1320 is shown in FIG. 12, multiple IC packages may be coupled to the interposer 1304; indeed, additional interposers may be coupled to the interposer 1304. The interposer 1304 may provide an intervening substrate used to bridge the circuit board 1302 and the IC package 1320. The IC package 1320 may be or include, for example, a die (the die 1002 of FIG. 10), or any other suitable component. Generally, the interposer 1304 may spread a connection to a wider pitch or reroute a connection to a different connection. For example, the interposer 1304 may couple the IC package 1320 (e.g., a die) to a set of ball grid array (BGA) conductive contacts of the coupling components 1316 for coupling to the circuit board 1302. In the embodiment illustrated in FIG. 12, the IC package 1320 and the circuit board 1302 are attached to opposing sides of the interposer 1304; in other embodiments, the IC package 1320 and the circuit board 1302 may be attached to a same side of the interposer 1304. In some embodiments, three or more components may be interconnected by way of the interposer 1304.

In some embodiments, the interposer 1304 may be formed as a PCB, including multiple metal layers separated from one another by layers of dielectric material and interconnected by electrically conductive vias. In some embodiments, the interposer 1304 may be formed of an epoxy resin, a fiberglass-reinforced epoxy resin, an epoxy resin with inorganic fillers, a ceramic material, or a polymer material such as polyimide. In some embodiments, the interposer 1304 may be formed of alternate rigid or flexible materials that may include the same materials described above for use in a semiconductor substrate, such as silicon, germanium, and other group III-V and group IV materials. The interposer 1304 may include metal interconnects 1308 and vias 1310, including but not limited to TSVs 1306. The interposer 1304 may further include embedded devices 1314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1304. The package-on-interposer structure 1336 may take the form of any of the package-on-interposer structures known in the art.

The IC device assembly 1300 may include an IC package 1324 coupled to the first surface 1340 of the circuit board 1302 by coupling components 1322. The coupling components 1322 may take the form of any of the embodiments discussed above with reference to the coupling components 1316, and the IC package 1324 may take the form of any of the embodiments discussed above with reference to the IC package 1320.

The IC device assembly 1300 illustrated in FIG. 12 includes a package-on-package structure 1334 coupled to the second surface 1342 of the circuit board 1302 by coupling components 1328. The package-on-package structure 1334 may include an IC package 1326 and an IC package 1332 coupled together by coupling components 1330 such that the IC package 1326 is disposed between the circuit board 1302 and the IC package 1332. The coupling components 1328 and 1330 may take the form of any of the embodiments of the coupling components 1316 discussed above, and the IC packages 1326 and 1332 may take the form of any of the embodiments of the IC package 1320 discussed above. The package-on-package structure 1334 may be configured in accordance with any of the package-on-package structures known in the art.

Figure 13:
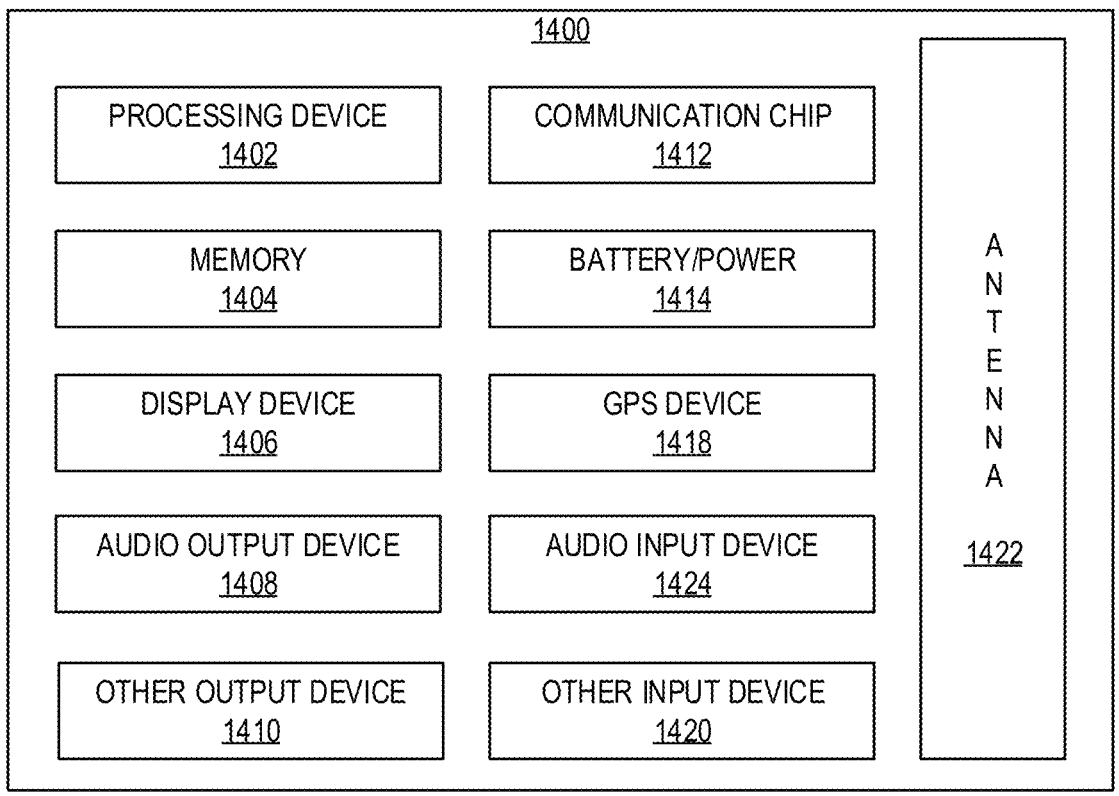
FIG. 13 is a block diagram of an example electrical device that may include a microelectronic assembly, in accordance with any of the embodiments disclosed herein.

FIG. 13 is a block diagram of an example electrical device 1400 that may include one or more of the microelectronic assemblies disclosed herein. For example, any suitable ones of the components of the electrical device 1400 may include one or more of the IC device assemblies 1300, IC devices 1100, or dies 1002 disclosed herein, and may be arranged in any of the microelectronic assemblies disclosed herein. A number of components are illustrated in FIG. 13 as included in the electrical device 1400, but any one or more of these components may be omitted or duplicated, as suitable for the application. In some embodiments, some or all of the components included in the electrical device 1400 may be attached to one or more motherboards. In some embodiments, some or all of these components are fabricated onto a single system-on-a-chip (SoC) die.

Additionally, in various embodiments, the electrical device 1400 may not include one or more of the components illustrated in FIG. 13, but the electrical device 1400 may include interface circuitry for coupling to the one or more components. For example, the electrical device 1400 may not include a display device 1406, but may include display device interface circuitry (e.g., a connector and driver circuitry) to which a display device 1406 may be coupled. In another set of examples, the electrical device 1400 may not include an audio input device 1424 or an audio output device 1408, but may include audio input or output device interface circuitry (e.g., connectors and supporting circuitry) to which an audio input device 1424 or audio output device 1408 may be coupled.

The electrical device 1400 may include a processing device 1402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1402 may include one or more digital signal processors (DSPs), application-specific integrated circuits (ASICs), CPUs, GPUs, cryptoprocessors (specialized processors that execute cryptographic algorithms within hardware), server processors, or any other suitable processing devices. The electrical device 1400 may include a memory 1404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1404 may include memory that shares a die with the processing device 1402. This memory may be used as cache memory and may include embedded dynamic random access memory (eDRAM) or spin transfer torque magnetic random access memory (STT-M RAM).

In some embodiments, the electrical device 1400 may include a communication chip 1412 (e.g., one or more communication chips). For example, the communication chip 1412 may be configured for managing wireless communications for the transfer of data to and from the electrical device 1400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1412 may implement any of a number of wireless standards or protocols, including but not limited to Institute of Electrical and Electronic Engineers (IEEE) standards including Wi-Fi (IEEE 802.11 family), IEEE 802.16 standards (e.g., IEEE 802.16-2005 Amendment), 3rd Generation Partnership Project (3GPP) Long-Term Evolution (LTE), 5G, and 5G New Radio, along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1412 may operate in accordance with other wireless protocols in other embodiments. The electrical device 1400 may include an antenna 1422 to facilitate wireless communications and/or to receive other wireless communications (such as AM or FM radio transmissions).

In some embodiments, the communication chip 1412 may manage wired communications, such as electrical, optical, or any other suitable communication protocols (e.g., the Ethernet). As noted above, the communication chip 1412 may include multiple communication chips. For instance, a first communication chip 1412 may be dedicated to shorter-range wireless communications such as Wi-Fi or Bluetooth, and a second communication chip 1412 may be dedicated to longer-range wireless communications such as global positioning system (GPS), EDGE, GPRS, CDMA, WiMAX, LTE, EV-DO, or others. In some embodiments, a first communication chip 1412 may be dedicated to wireless communications, and a second communication chip 1412 may be dedicated to wired communications.

The electrical device 1400 may include battery/power circuitry 1414. The battery/power circuitry 1414 may include one or more energy storage devices (e.g., batteries or capacitors) and/or circuitry for coupling components of the electrical device 1400 to an energy source separate from the electrical device 1400 (e.g., AC line power).

The electrical device 1400 may include a display device 1406 (or corresponding interface circuitry, as discussed above). The display device 1406 may include any visual indicators, such as a heads-up display, a computer monitor, a projector, a touchscreen display, a liquid crystal display (LCD), a light-emitting diode display, or a flat panel display.

The electrical device 1400 may include an audio output device 1408 (or corresponding interface circuitry, as discussed above). The audio output device 1408 may include any device that generates an audible indicator, such as speakers, headsets, or earbuds.

The electrical device 1400 may include an audio input device 1424 (or corresponding interface circuitry, as discussed above). The audio input device 1424 may include any device that generates a signal representative of a sound, such as microphones, microphone arrays, or digital instruments (e.g., instruments having a musical instrument digital interface (MIDI) output).

The electrical device 1400 may include a GPS device 1418 (or corresponding interface circuitry, as discussed above). The GPS device 1418 may be in communication with a satellite-based system and may receive a location of the electrical device 1400, as known in the art.

The electrical device 1400 may include another output device 1410 (or corresponding interface circuitry, as discussed above). Examples of the other output device 1410 may include an audio codec, a video codec, a printer, a wired or wireless transmitter for providing information to other devices, or an additional storage device.

The electrical device 1400 may include another input device 1420 (or corresponding interface circuitry, as discussed above). Examples of the other input device 1420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1400 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra-mobile personal computer, a portable computing device, etc.), a desktop electrical device, a server or other networked computing device, a printer, a scanner, a monitor, a set-top box, an entertainment control unit, a vehicle control unit, a digital camera, a digital video recorder, or a wearable computing device. In some embodiments, the electrical device 1400 may be any other electronic device that processes data.

The following paragraphs provide various examples of the embodiments disclosed herein.

Example 1 is a microelectronic assembly, including: a substrate; a bridge, having a first surface and an opposing second surface, embedded in the substrate, wherein the bridge includes an integral passive component, and wherein the second surface of the bridge includes first contacts in a first bridge interconnect area and second contacts in a second bridge interconnect area; a first die coupled to the integral passive component via the first contacts in the first bridge interconnect area; and a second die coupled to the second contacts in the second bridge interconnect area.

Example 2 may include the subject matter of Example 1, and may further specify that the integral passive component is a thin film resistor (TFR).

Example 3 may include the subject matter of Example 2, and may further specify that the TFR is part of a calibration circuit.

Example 4 may include the subject matter of Example 1, and may further specify that the integral passive component is an array of capacitors.

Example 5 may include the subject matter of Example 4, and may further specify that an individual capacitor in the array of capacitors is one of a trench capacitor, a metal-oxide-semiconductor (MOS) capacitor, a metal-insulator-metal (MIM) capacitor, or a parallel plate capacitor.

Example 6 may include the subject matter of Example 4, and may further specify that the array of capacitors is part of an input/output circuit.

Example 7 may include the subject matter of Example 4, and may further specify that the array of capacitors is to mitigate electromagnetic interference (EMI) generated by the first die or by the second die.

Example 8 may include the subject matter of Example 1, and may further specify that the bridge includes conductive pathways, that the second surface of the bridge further includes third contacts in a third bridge interconnect area; and that the first die is coupled to the second die via the third contacts and the conductive pathways in the bridge.

Example 9 may include the subject matter of Example 1, and may further specify that the integral passive component is a first integral passive component, and that the bridge further including a second integral passive component coupled to the first die via the first contacts in the first bridge interconnect area.

Example 10 may include the subject matter of Example 9, and may further specify that the first integral passive component is a TFR and the second integral passive component is a capacitor.

Example 11 may include the subject matter of Example 9, and may further specify that the first integral passive component is at the second surface of the bridge.

Example 12 may include the subject matter of Example 9, and may further specify that the second integral passive component is between the first surface and the second surface of the bridge.

Example 13 may include the subject matter of Example 1, and may further specify that the first die is a central processing unit, platform controller hub, graphics processing unit, memory, or an input/output interface.

Example 14 may include the subject matter of Example 1, and may further specify that the second die is a graphics processing unit, memory, or a voltage regulator.

Example 15 is a computing device, including: a circuit board; and an integrated circuit (IC) package disposed on the circuit board, wherein the IC package includes: a package substrate; a bridge, having opposing first and second faces, wherein the second face includes first contacts in a first interconnect area and second contacts in a second interconnect area, wherein the bridge is embedded in the package substrate, and wherein the bridge includes: a thin film resistor (TFR) at the second face, wherein a conductive portion of the TFR is disposed on a layer of an insulating material between the first and second faces; and a die coupled to the TFR via the first contacts.

Example 16 may include the subject matter of Example 15, and may further specify that the TFR is part of a calibration circuit.

Example 17 may include the subject matter of Example 15, and may further specify that the bridge further includes: a capacitor between the first and second faces.

Example 18 may include the subject matter of Example 15, and may further specify that the TFR is one of a plurality of TFRs at the second face of the bridge.

Example 19 may include the subject matter of Example 18, and may further specify that the die is a first die and the computing device further includes: a second die coupled to one of the plurality of TFRs via the second contacts.

Example 20 may include the subject matter of Example 19, and may further specify that the first die is a central processing unit and the second die is a graphics processing unit.

Example 21 may include the subject matter of Examples 15-20, and may further specify that the computing device is a server device.

Example 22 may include the subject matter of Examples 15-20, and may further specify that the computing device is a portable computing device.

Example 23 may include the subject matter of Examples 15-20, and may further specify that the computing device is a wearable computing device.

Example 24 is an integrated circuit (IC) package, including: a package substrate; a bridge, having opposing first and second faces, wherein the second face includes first contacts in a first interconnect area and second contacts in a second interconnect area, wherein the bridge is embedded in the package substrate, and wherein the bridge includes: an insulating material between the first and second faces; a first capacitor, wherein a conductive portion of the first capacitor is disposed on a first layer of the insulating material between the first and second faces; and a second capacitor, wherein a conductive portion of the second capacitor is disposed on a second layer of the insulating material between the first and second faces; a first die coupled to the first capacitor via the first contacts; and a second die coupled to the second capacitor via the second contacts.

Example 25 may include the subject matter of Example 24, and may further specify that the first layer and the second layer of the insulating material are different layers in the insulating material.

Example 26 may include the subject matter of Example 24, and may further specify that the first layer and the second layer of the insulating material are a same layer in the insulating material.

Example 27 may include the subject matter of Example 24, and may further specify that the first capacitor and the second capacitor are parallel plate capacitors.

Example 28 may include the subject matter of Example 24, and may further specify that the first capacitor and the second capacitor are part of an array of capacitors.

Example 29 may include the subject matter of Example 24, and may further specify that the first capacitor is part of an input/output circuit in the first die and the second capacitor is part of an input/output circuit in the second die.

Example 30 may include the subject matter of Example 24, and may further specify that the bridge further includes a thin film resistor (TFR).

Example 31 may include the subject matter of Example 24, and may further specify that the bridge further includes conductive pathways, that the second face of the bridge further includes third contacts in a third interconnect area, and that the first die is coupled to the second die via the third contacts and the conductive pathways in the bridge.

Example 32 may include the subject matter of Example 24, and may further specify that the second face of the bridge further includes fourth contacts in a fourth interconnect area, and the IC package further includes a third die coupled to the bridge via the fourth contacts.

The invention claimed is:

1. A microelectronic assembly, comprising:
a bridge embedded in a substrate,
the bridge having a bridge substrate layer at a first surface side and one or more routing layers at an opposing second surface side,
a first integral passive component in the bridge substrate layer,
a second integral passive component in the one or more routing layers,
a first die coupled to the first and second integral passive components via first and second contacts on the bridge,
a second die coupled to the first die via a first conductive pathway of the one more routing layers,
a third die coupled to the second die via a second conductive pathway directly embedded in a material of the substrate away from the bridge.

2. The microelectronic assembly of claim 1, wherein the first or second integral passive component is a thin film resistor (TFR).

3. The microelectronic assembly of claim 2, wherein the TFR is part of a calibration circuit.

4. The microelectronic assembly of claim 1, wherein the first or second integral passive component is an array of capacitors.

5. The microelectronic assembly of claim 4, wherein an individual capacitor in the array of capacitors is one of a trench capacitor, a metal-oxide-semiconductor (MOS) capacitor, a metal-insulator-metal (MIM) capacitor, or a parallel plate capacitor.

6. The microelectronic assembly of claim 4, wherein the array of capacitors is part of an input/output circuit.

7. The microelectronic assembly of claim 1, wherein the first integral passive component is a thin film transistor (TFR) and the second integral passive component is a capacitor.

8. The microelectronic assembly of claim 1, wherein the second integral passive component is at the second surface of the bridge.

9. The microelectronic assembly of claim 1, further comprising:
a third integral passive component in the one or more routing layers, and wherein the second die is coupled to the third integral passive component via a third contact on the bridge.

10. A computing device, comprising:
a circuit board; and
an integrated circuit (IC) package disposed on the circuit board, wherein the IC package includes:
a bridge embedded in a package substrate;
the bridge having a bridge substrate layer at a first surface side and one or more routing layers at an opposing second surface side,
a first thin film transistor (TFR) in the bridge substrate layer,
a second thin film transistor (TFR) in the one or more routing layers,
a first die coupled to the first and second TFRs via first and second contacts on the bridge,
a second die coupled to the first die via a first conductive pathway of the one more routing layers,
a third die coupled to the second die via a second conductive pathway directly embedded in a material of the substrate away from the bridge.

11. The computing device of claim 10, wherein the first TFR is part of a calibration circuit.

12. The computing device of claim 10, wherein the bridge further comprises:
a capacitor in the one or more routing layers.

13. The computing device of claim 10, wherein the second TFR is one of a plurality of TFRs in the one or more routing layers.

14. An integrated circuit (IC) package, comprising:
a bridge embedded in a package substrate;
the bridge having a bridge substrate layer at a first surface side and one or more routing layers at an opposing second surface side,
a first capacitor in the bridge substrate layer,
a second capacitor in the one or more routing layers,
a first die coupled to the first and second capacitors via first and second contacts on the bridge,
a second die coupled to the first die via a first conductive pathway of the one more routing layers,
a third die coupled to the second die via a second conductive pathway directly embedded in a material of the substrate away from the bridge.

15. The IC package of claim 8, further comprising:
a circuit board, wherein the third die is coupled to the circuit board via a third conductive pathway directly embedded in a material of the package substrate away from the bridge.

16. The IC package of claim 14, wherein the first capacitor and the second capacitor are parallel plate capacitors.

17. The IC package of claim 14, wherein the first capacitor and the second capacitor are part of an array of capacitors.

* * * * *